United States Patent
Shamir

(10) Patent No.: US 9,726,700 B2
(45) Date of Patent: Aug. 8, 2017

(54) METHOD FOR OPERATION OF A SELF-POWERED POWER SENSOR (SPPS) HAVING A RESERVOIR CAPACITOR

(71) Applicant: Panoramic Power Ltd., Kfar Saba (IL)

(72) Inventor: Adi Shamir, Kidron (IL)

(73) Assignee: Panoramic Power Ltd., Kfar Saba (IL)

( * ) Notice: Subject to any disclaimer, the term of this patent is extended or adjusted under 35 U.S.C. 154(b) by 0 days.

(21) Appl. No.: 14/841,117

(22) Filed: Aug. 31, 2015

(65) Prior Publication Data

US 2015/0369848 A1 Dec. 24, 2015

Related U.S. Application Data

(63) Continuation of application No. 13/301,453, filed on Nov. 21, 2011, now Pat. No. 9,134,348, and a
(Continued)

(51) Int. Cl.
*G01R 21/00* (2006.01)
*G01R 15/18* (2006.01)
(Continued)

(52) U.S. Cl.
CPC .......... *G01R 21/006* (2013.01); *G01R 15/18* (2013.01); *G01R 15/186* (2013.01);
(Continued)

(58) Field of Classification Search
CPC ..... Y02B 70/1441; Y02B 70/16; H02J 5/005; H02J 7/025; H02M 3/158; H02M 3/1588;
(Continued)

(56) References Cited

U.S. PATENT DOCUMENTS 2,973,494 A 2/1961 Ellis
3,517,311 A 6/1970 Wasielewski et al.
(Continued)

FOREIGN PATENT DOCUMENTS

EP 1524567 4/2005
EP 1703289 9/2006
(Continued)

OTHER PUBLICATIONS

"Office Action Dated Jul. 19, 2016; U.S. Appl. No. 13/924,264", (Jul. 19, 2016).
(Continued)

*Primary Examiner* — Son Le
*Assistant Examiner* — Dustin Dickinson
(74) *Attorney, Agent, or Firm* — Blakely Sokoloff Taylor & Zafman LLP

(57) ABSTRACT

Methods of operation of a self-powered power sensor (SPPS) are provided for the measurement of the likes of current, power, power factor, and other parameters related to the power consumption, at points of interest, such as circuit breakers, machines, and the like. Each SPPS is enabled to communicate its respective data, in an environment of a plurality of such apparatuses, to a management unit which may further process the data sent thereto, as well as communicate back to the SPPS for the purpose of synchronization of, for example, clocks of the SPPS and the management unit.

10 Claims, 11 Drawing Sheets

Related U.S. Application Data continuation-in-part of application No. 12/760,867, filed on Apr. 15, 2010, now abandoned.

(60) Provisional application No. 61/492,401, filed on Jun. 2, 2011, provisional application No. 61/169,750, filed on Apr. 16, 2009, provisional application No. 61/272,216, filed on Sep. 2, 2009.

(51) Int. Cl.
| | |
|---|---|
| *G01R 21/133* | (2006.01) |
| *H02M 3/158* | (2006.01) |
| *G01R 19/25* | (2006.01) |
| *H02J 13/00* | (2006.01) |
| *G01R 19/00* | (2006.01) |
| G01R 22/06 | (2006.01) |

(52) U.S. Cl.
CPC ..... *G01R 19/0092* (2013.01); *G01R 19/2513* (2013.01); *G01R 21/133* (2013.01); *H02J 13/0006* (2013.01); *H02M 3/1582* (2013.01); G01R 22/063 (2013.01)

(58) Field of Classification Search
CPC .... H02M 3/1582; H04B 5/0037; H01F 38/14; H01F 2038/146; Y02T 90/122; G01R 33/3628; G01R 15/183; G01R 15/186; G01R 22/063; G01R 21/06; G01R 19/2513; G01R 35/02
See application file for complete search history.

(56) References Cited

U.S. PATENT DOCUMENTS

| | | | |
|---|---|---|---|
| 3,835,397 A | 9/1974 | D'Antonio | |
| 4,709,339 A | 11/1987 | Fernandes | |
| 4,808,868 A | 2/1989 | Roberts | |
| 5,006,846 A | 4/1991 | Granville et al. | |
| 5,694,304 A | 12/1997 | Telefus et al. | |
| 5,962,987 A | 10/1999 | Statnic | |
| 5,995,911 A | 11/1999 | Hart | |
| 6,018,700 A | 1/2000 | Edel | |
| 6,160,697 A | 12/2000 | Edel | |
| 6,259,372 B1 | 7/2001 | Taranowski et al. | |
| 6,417,661 B1 | 7/2002 | Berkcan et al. | |
| 6,433,981 B1 | 8/2002 | Fletcher et al. | |
| 6,470,283 B1 | 10/2002 | Edel | |
| 6,727,684 B2 | 4/2004 | Hatanaka | |
| 6,756,776 B2 | 6/2004 | Perkinson et al. | |
| 6,798,209 B2 | 9/2004 | Lavoie et al. | |
| 6,825,650 B1 | 11/2004 | McCormack et al. | |
| 7,058,524 B2 | 6/2006 | Hayes et al. | |
| D534,120 S | 12/2006 | Ricci et al. | |
| 7,145,322 B2 | 12/2006 | Solveson et al. | |
| 7,242,157 B1 | 7/2007 | Edel | |
| 7,253,602 B2 | 8/2007 | Shvach et al. | |
| 7,282,944 B2 | 10/2007 | Gunn et al. | |
| 7,321,226 B2 | 1/2008 | Yakymyshyn et al. | |
| 7,436,641 B2 | 10/2008 | Holley | |
| 7,453,267 B2 | 11/2008 | Westbrock, Jr. et al. | |
| 7,463,986 B2 | 12/2008 | Hayes | |
| 7,557,563 B2 | 7/2009 | Gunn et al. | |
| 7,561,035 B2 | 7/2009 | Sahashi et al. | |
| 7,876,086 B2 | 1/2011 | Jansen et al. | |
| 8,022,690 B2 | 9/2011 | Kagan | |
| 8,065,099 B2 * | 11/2011 | Gibala | G01R 22/063 340/5.9 |
| 8,190,381 B2 * | 5/2012 | Spanier | G01R 22/10 702/60 |
| 8,421,444 B2 | 4/2013 | Gunn | |
| 9,383,394 B2 | 7/2016 | Banting et al. | |
| 2001/0017782 A1 | 8/2001 | Hickman | |
| 2003/0014678 A1 | 1/2003 | Ozcetin et al. | |
| 2003/0155901 A1 | 8/2003 | Yasumura | |
| 2005/0057242 A1 | 3/2005 | Swain | |
| 2005/0132241 A1 | 6/2005 | Curt et al. | |
| 2005/0206530 A1 | 9/2005 | Cumming et al. | |
| 2006/0085144 A1 * | 4/2006 | Slota | G01R 35/04 702/57 |
| 2006/0119344 A1 | 6/2006 | Benke et al. | |
| 2006/0193152 A1 | 8/2006 | Ushijima | |
| 2006/0202667 A1 | 9/2006 | Klaffenbach et al. | |
| 2006/0224335 A1 | 10/2006 | Borleske et al. | |
| 2006/0224336 A1 | 10/2006 | Petras et al. | |
| 2006/0279910 A1 | 12/2006 | Gunn et al. | |
| 2006/0284647 A1 | 12/2006 | Gunn et al. | |
| 2007/0024269 A1 | 2/2007 | Tadatsu | |
| 2007/0059986 A1 | 3/2007 | Rockwell | |
| 2007/0085487 A1 | 4/2007 | Kuennen et al. | |
| 2007/0136010 A1 | 6/2007 | Gunn et al. | |
| 2007/0257647 A1 | 11/2007 | Chen et al. | |
| 2008/0024094 A1 | 1/2008 | Nishihara et al. | |
| 2008/0077336 A1 | 3/2008 | Fernandes | |
| 2008/0084201 A1 | 4/2008 | Kojori | |
| 2008/0088297 A1 | 4/2008 | Makinson et al. | |
| 2008/0116880 A1 | 5/2008 | McEachern et al. | |
| 2008/0117014 A1 | 5/2008 | Waeckerle et al. | |
| 2008/0122642 A1 | 5/2008 | Radtke et al. | |
| 2008/0129215 A1 | 6/2008 | Boys | |
| 2008/0157904 A1 | 7/2008 | Dominguez et al. | |
| 2008/0172192 A1 | 7/2008 | Banhegyesi | |
| 2008/0215278 A1 | 9/2008 | Colsch et al. | |
| 2008/0224892 A1 | 9/2008 | Bogolea et al. | |
| 2008/0266056 A1 | 10/2008 | Alomar | |
| 2009/0051557 A1 | 2/2009 | Beatty et al. | |
| 2009/0112496 A1 | 4/2009 | Suzuki | |
| 2009/0115403 A1 | 5/2009 | Bernklau | |
| 2009/0115509 A1 | 5/2009 | Minteer | |
| 2009/0167291 A1 | 7/2009 | Richeson et al. | |
| 2009/0167547 A1 | 7/2009 | Gilbert | |
| 2009/0207034 A1 * | 8/2009 | Tinaphong | H02H 9/042 340/635 |
| 2009/0240449 A1 | 9/2009 | Gibala et al. | |
| 2009/0289506 A1 | 11/2009 | Harres | |
| 2010/0013457 A1 | 1/2010 | Nero, Jr. | |
| 2010/0020579 A1 | 1/2010 | Melanson | |
| 2010/0023283 A1 | 1/2010 | Boutorabi et al. | |
| 2010/0085036 A1 | 4/2010 | Banting et al. | |
| 2010/0153036 A1 | 6/2010 | Elwarry et al. | |
| 2010/0264906 A1 | 10/2010 | Shamir et al. | |
| 2011/0082599 A1 | 4/2011 | Shinde et al. | |
| 2011/0128656 A1 | 6/2011 | Kohler | |
| 2012/0208479 A1 | 8/2012 | Pistor et al. | |
| 2014/0200843 A1 | 7/2014 | Shamir et al. | |
| 2014/0266240 A1 | 9/2014 | Haensgen et al. | |

FOREIGN PATENT DOCUMENTS

| | | |
|---|---|---|
| GB | 2338790 | 12/1999 |
| GB | 2448741 | 10/2008 |
| WO | WO-99/43010 | 8/1999 |

OTHER PUBLICATIONS

"Office Action Dated Jul. 26, 2016; U.S. Appl. No. 14/586,605", (Jul. 26, 2016).
"Office Action Dated Apr. 26, 2016; United Kingdom Patent Application No. 1321183.4", (Apr. 26, 2016).
"Office Action Dated Jul. 1, 2016; U.S. Appl. No. 14/211,587", (Jul. 1, 2016).
"Office Action Dated Jun. 15, 2016; U.S. Appl. No. 15/081,656", (Jun. 15, 2016).
"Office Action Dated Jun. 21, 2016; U.S. Appl. No. 15/081,666", (Jun. 21, 2016).
"Notice of Allowance Dated May 7, 2015; U.S. Appl. No. 13/301,453", (May 7, 2015).
"Office Action Dated Aug. 12, 2014; U.S. Appl. No. 13/301,453", (Aug. 12, 2014).
"Office Action Dated Feb. 19, 2016; U.S. Appl. No. 14/586,605", (Feb. 19, 2016).

(56) References Cited

OTHER PUBLICATIONS

"Office Action Dated Mar. 9, 2016; U.S. Appl. No. 13/924,264", (Mar. 9, 2016).
"Office Action Dated May 19, 2014; U.S. Appl. No. 13/301,453", (May 19, 2014).
"International Search Report and Written Opinion of the International Searching Authority Dated Aug. 10, 2010; International Application No. PCT/IB2010/000846", (Aug. 10, 2010).
"International Search Report and Written Opinion of the International Searching Authority Dated May 16, 2012; International Application No. PCT/IL2012/00013", (May 16, 2012).
"Notice of Allowance Dated Jan. 14, 2014; United Kingdom Patent Application No. 1307220.2", (Jan. 14, 2014).
"Notice of Allowance Dated Jan. 28, 2014; United Kingdom Patent Application No. 1316868.7", (Jan. 28, 2014).
"Notice of Allowance Dated Jan. 7, 2014; United Kingdom Patent Application No. 1119518.7", (Jan. 7, 2014).
"Notice of Allowance Dated Jun. 1, 2015; Chinese Patent Application No. 201080025086.3", (Jun. 1, 2015).
"Office Action Dated Aug. 19, 2014; Chinese Patent Application No. 201080025086.3", (Aug. 19, 2014).
"Office Action Dated Feb. 13, 2015; Chinese Patent Application No. 201080025086.3", (Feb. 13, 2015).
"Office Action Dated Feb. 19, 2013; United Kingdom Patent Application No. 1119518.7", (Feb. 19, 2013).
"Office Action Dated Feb. 24, 2014; U.S. Appl. No. 12/760,867", filed Feb. 24, 2014.
"Office Action Dated Jan. 23, 2013; U.S. Appl. No. 12/760,867", filed Jan. 23, 2013.
"Office Action Dated May 2, 2014; U.S. Appl. No. 12/760,867", filed May 2, 2014.
"Office Action Dated May 24, 2013; United Kingdom Patent Application No. 1119518.7", (May 24, 2013).
"Office Action Dated May 24, 2013; United Kingdom Patent Application No. 1307220.2", (May 24, 2013).
"Office Action Dated Nov. 11, 2013; Chinese Patent Application No. 201080025086.3", (Nov. 11, 2013).
"Office Action Dated Nov. 8, 2013; U.S. Appl. No. 12/760,867", filed Nov. 8, 2013.
"Office Action Dated Oct. 27, 2014; U.S. Appl. No. 12/760,867", filed Oct. 27, 2014.
"Office Action Dated Oct. 29, 2013; United Kingdom Patent Application No. 1119518.7", (Oct. 29, 2013).
"Office Action Dated Oct. 29, 2013; United Kingdom Patent Application No. 1307220.2", (Oct. 29, 2013).
"Office Action Dated Oct. 29, 2013; United Kingdom Patent Application No. 1316868.7", (Oct. 29, 2013).
"Office Action Dated Sep. 19, 2013; German Patent Application No. 112010001638.0", (Sep. 19, 2013).
"Office Action Dated Sep. 20, 2012; U.S. Appl. No. 12/760,867", filed Sep. 20, 2012.
"Applicant-Initiated Interview Summary Dated Feb. 7, 2017; U.S. Appl. No. 13/924,264", filed Feb. 7, 2017.
"Notice of Allowance Dated Feb. 9, 2017; U.S. Appl. No. 14/211,587", filed Feb. 9, 2017.
"Notice of Allowance Dated Feb. 9, 2017; U.S. Appl. No. 15/081,656", filed Feb. 9, 2017.
"Notice of Allowance Dated Feb. 24, 2017; U.S. Appl. No. 15/081,666", filed Feb. 24, 2017.
"Office Action Dated Dec. 19, 2016; U.S. Appl. No. 13/924,264", filed Dec. 19, 2016.
"Office Action Dated Dec. 22, 2016; U.S. Appl. No. 14/586,605", filed Dec. 22, 2016.
"Office Action Dated Feb. 20, 2017; United Kingdom Patent Application No. 1321183.4", (Feb. 20, 2017).
"Office Action Dated Feb. 20, 2017; United Kingdom Patent Application No. 1701306.1", (Feb. 20, 2017).
"Office Action Dated Feb. 20, 2017; United Kingdom Patent Application No. 1701307.9", (Feb. 20, 2017).
"Office Action Dated Oct. 7, 2016; United Kingdom Patent Application No. 1321183.4", (Oct. 7, 2016).
ISA—The Instrumentation, Systems, and Automation Society , "ANSI/ISA—61010-1 (82.02.01), CSA C22.2 No. 1010.1, ANSI/UL 61010-1, Formerly ANSI/ISA—82.02.01-1999 (IEC 61010-1 Mod), Safety Requirements for Electrical Equipment for Measurement, Control, and Laboratory Use", Section 10.1, (Jul. 12, 2004), p. 94.
The Great Soviet Encyclopedia, "Magnetization Curve", downloaded from http://encyclopedia2.thefreedictionary.com/Magnetization+Curve, (1979), 2 pp. total.
"Intention to Grant, United Kingdom Patent Application No. 1321183.4", (Apr. 5, 2017).
"Intention to Grant, United Kingdom Patent Application No. 1701306.1", (Apr. 27, 2017).
"Intention to Grant, United Kingdom Patent Application No. 1701307.9", (Apr. 27, 2017).
"Decision to Grant dated Mar. 21, 2017; German Patent Application No. 112010001638.0", (Mar. 21, 2017).
"Notice of Allowance dated Mar. 22, 2017; U.S. Appl. No. 14/586,605", (Mar. 22, 2017).
"Notice of Allowance dated Mar. 28, 2017; U.S. Appl. No. 13/924,264", (Mar. 28, 2017).
"U.S. Appl. No. 61/103,603, filed Oct. 8, 2008", (Apr. 8, 2010).

\* cited by examiner

METHOD FOR OPERATION OF A SELF-POWERED POWER SENSOR (SPPS) HAVING A RESERVOIR CAPACITOR

CROSS-REFERENCE TO RELATED APPLICATIONS

This application is a continuation of U.S. patent application Ser. No. 13/301,453 filed Nov. 21, 2011, now allowed, which claims the benefit of U.S. Provisional Patent Application No. 61/492,401 filed Jun. 2, 2011, and is a continuation-in-part of U.S. patent application Ser. No. 12/760,867 filed Apr. 15, 2010 (published as U.S. Patent Application Publication No. 2010/0264906), which claims the benefit of U.S. Provisional Patent Application No. 61/169,750 filed Apr. 16, 2009 and U.S. Provisional Patent Application No. 61/272,216 filed Sep. 2, 2009.

BACKGROUND OF THE INVENTION

1. Field of the Invention

This invention generally relates to the measurement of power consumption and more specifically to non-intrusive and self-powered measurement of the power factor of a circuit.

2. Prior Art

In a typical electricity distribution system, power is provided through a main circuit breaker and a device for measurement of the power consumption of the entire electrical network connected thereto. However, typically, the main power line is then connected to a plurality of circuit breakers, each feeding a smaller section of the electrical network with its specific power requirements. The circuit breaker is adjusted to the amount of maximum current that may be used by this electrical sub-network. In industrial and commercial applications, hundreds of such circuit breakers may be installed, each controlling a section of the electrical network. Even in smaller locations, such as a house, it is not unusual to find tens of circuit breakers controlling various electrical sub-networks.

Non-intrusive measurement of current through a power line conductor has well known principles. A current transformer (CT) of sorts is created that comprises the primary winding as the power line conductor and the secondary providing an output current inversely proportionate to the number of windings. Typically such systems are used for measuring currents in very high voltage or current environments, for example, as shown in Gunn et al. in U.S. Pat. No. 7,557,563. These types of apertures are useful for main power supplies. Using such devices, or power meters for that matter, is deficient for the purposes of measuring relatively low currents in an environment of a plurality of circuit breakers. Providing wireless telemetry on a singular basis, such as suggested by Gunn et al., and other prior art solutions, suffers from deficiencies when operating in a noisy environment.

The power factor (cos $\phi$) of an alternate current (AC) is defined as the ratio between the real power and the apparent power of the circuit, where the apparent power is the average voltage multiplied by the average current consumed by the load, and the active power is the power which is actually consumed by the load, taking into consideration the loss of reactive energy oscillating between the network and the device. The power factor is therefore a number between 0 and 1, having a value of 1 for a purely resistive load that has a zero phase shift of the current with respect of the voltage. However typical loads are not purely resistive, as the current is distorted and contains higher frequency harmonics, as well as a phase shift relative to the pure voltage signal. As a result the power factor is lower than 1. Commercially available metering devices are often bound to standards and customer requirements enforcing measurement of the power factor in order to calculate the actual power consumed.

Measuring the power factor of a circuit requires simultaneous measurement of both voltage and current. Existing sub-metering solutions, that are systems designed to meter electricity at several branches of the electric grid inside a building, typically comprise of a meter mounted inside or next to an electric circuit breaker closet, also referred to at times as a panel-board. The meter is hardwired to the voltage line in order to measure the voltage, and is also hardwired to one or more current transformers ('CT') for the purpose of measuring the current in one or more locations in the panel board. The major drawback of this approach is observed when the number of circuits to be measured, i.e., the sub-metering granularity, increases, as more CT's must be wired inside the panel-board. Wiring becomes intensive and the cost and invasiveness of the installation increases. As sub-meters need to be hardwired both to the voltage and CT's at least one meter is needed in each panel. As sub-meters are typically limited by the number of CT's they can handle, it may be necessary to have more than a single meter in each panel board.

There is a need in the art that is now developing, resulting from the move toward energy conservation to enable measurement and analysis of the power factor of a circuit grid on a finer granularity. It would be advantageous if a solution may be provided for installation of such a solution in a panel board for existing circuit breakers. It would be further advantageous to enable a fine granularity of measurement of the current without causing congestion in the panel board. It would be therefore beneficial to overcome the limitations of the prior art by resolving these deficiencies.

DETAILED DESCRIPTION OF THE PREFERRED EMBODIMENTS

Apparatus and methods are provided for the measurement of power consumption at points of interest, such as circuit breakers, machines and the like. Accordingly, means are provided for measurement of power consumption for each electrical sub-network that is controlled by a circuit breaker. Each apparatus is enabled to communicate its respective data, in an environment of a plurality of such apparatuses, to a management unit which is enabled to provide finer granularity power consumption profiles. Challenges of measuring relatively low supply currents, wireless operation in an environment of a large number of apparatuses, and self-powering are addressed.

Figure 1:
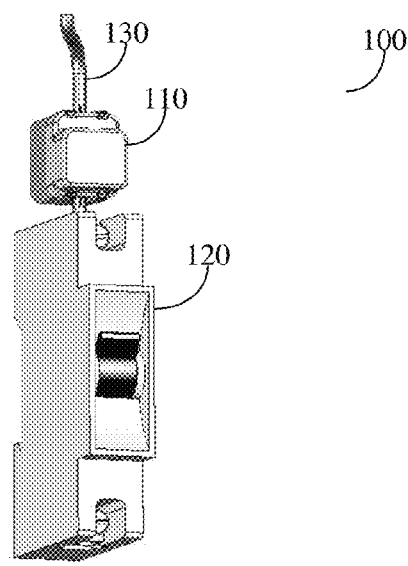
FIG. 1 is a circuit breaker equipped with a compatible self-powered power sensor deployed in accordance with the invention.

Reference is now made to FIG. 1 where an exemplary and non-limiting system 100 is equipped with a compatible self-powered power sensor (SPPS) 110 deployed in accordance with the invention. The SPPS 110 is designed to fit either above or below the circuit breaker 120 which is of standard size such that it fits into current circuit breaker closets without modification. The SPPS 110 housing is designed, as discussed in further detail below, to wrap around the power line 130 leading to or going out of the circuit breaker 120. The SPPS 110 is designed to enable easy installation at an existing location or otherwise during construction when the entire electrical network is put in place.

Figure 2:
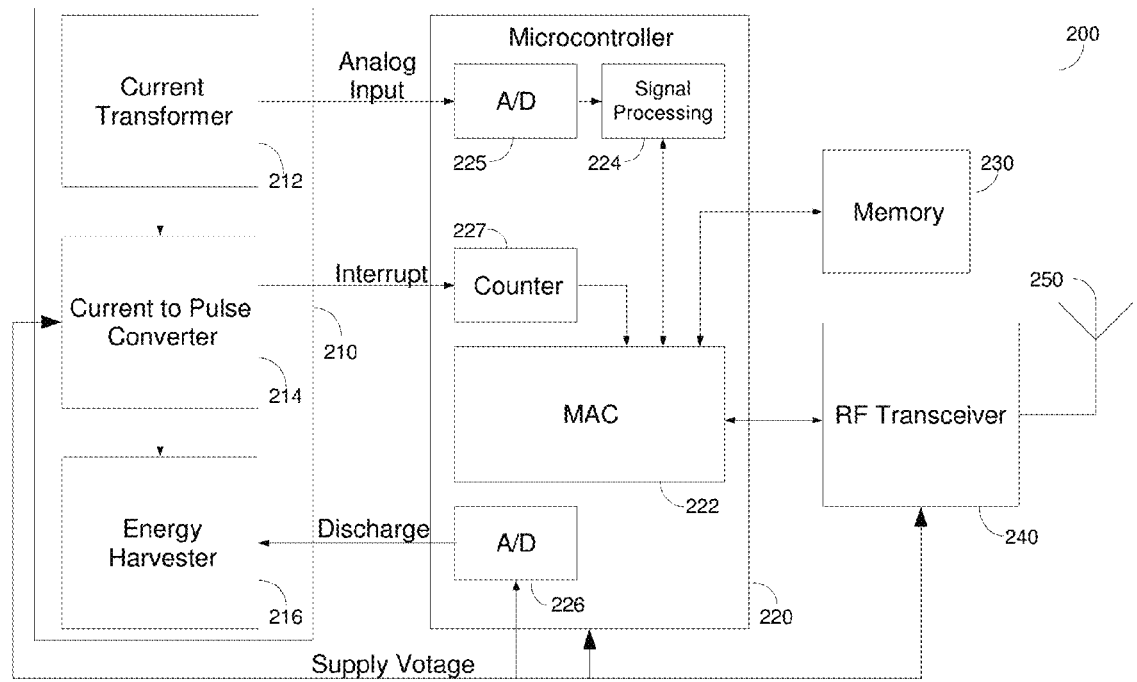
FIG. 2 is a block diagram of a first embodiment of a self-powered sensor in accordance with the invention.

The SPPS contains an electrical circuit the exemplary and non-liming circuit 200 which is shown in block diagram form in FIG. 2. The circuit 200 comprises an analog section 210 that is coupled to a microcontroller 220. The analog section comprises a current transformer 212 to transform current from the power line, for example power line 130, to a lower current. The power sensed there from is used for two purposes, the first is to provide the power needed for the operation of the SPPS 110 and the second is to sense the actual power consumption of the load connected to the power line 130. The current to pulse converter (C2PC) 214 is used to generate periodically a pulse that is provided to the microcontroller unit (MCU) 220 and enables the measurement of the power consumption. The more frequent the pulses the higher the power consumption. The energy harvester 216 stores energy to be used as the power supply for the circuitry of SPPS 110. It is further enabled to receive a discharge signal from the microcontroller 220 to enable intentional discharge of the energy harvester 216 and prevent overcharge. In one embodiment of the invention a Zener diode (not shown) is used to clamp the voltage to the desired level thereby preventing overcharge.

The circuit 200 further comprises a MCU 220 that is comprised of several components. An analog-to-digital (A/D) converter 225 that is coupled to a signal processor 224 which is further coupled to the media access control (MAC) 222 that supports the communication protocol of the SPPS. The MAC 222 provides the data-link layer of the 7 layer standard model of a communication system. This involves the creation in hardware, software, firmware or combination thereof, of data frames, timing their transmission, received signal strength indication (RSSI), acknowledgements, clock synchronization etc. A counter 227 is excited by an interrupt signal received from the analog section 210 and enables the counting of the number of pulses that, as noted above, is proportionate to the power consumed for a given unit of time. Another A/D converter 226 is used to measure the output of the energy harvester 216, and in one embodiment, under control of MCU 220, to cause a discharge thereof as may be needed and as further explained below. In another embodiment, further explained herein below, it can be used to detect that the load connected to the measured power line was turned off. A memory 230 is coupled to the MCU 220 that can be used as scratch pad memory 230 as well as memory for storage of the plurality of instructions that when executed by the MCU 220 executes the methods discussed herein. Memory 230 may comprise random access memory (RAM), read only memory (ROM), non-volatile memory (NVM), other memory types and combinations thereof.

A radio frequency (RF) transceiver 240 is coupled to the MCU 220 and to an antenna 250 to provide one or two-way communication with a management unit, discussed in more detail below. In one embodiment of the invention the RF transceiver 240 supports transmission only, i.e., uplink communication. However, the RF transceiver 240 may comprise a receiver portion to support features such as, and without limitation, sensing for a carrier signal, clock synchronization, acknowledgement, firmware download, and configuration download. Typically, this should be an unlicensed industrial scientific medical (ISM) band transceiver, operative, for example and without limitation, at 2.4 Ghz. In one embodiment some form of spread-spectrum modulation technique may be used, for example and without limitation, direct sequence spread spectrum (DSSS), to enable better coexistence with other systems working in the same environment. The communication rate, discussed in more detail below, should be high enough to enable coexistence of a couple of hundred SPPSs in the same electrical closet. The power consumption of the RF transceiver 240 should be low enough to adhere with the energy harvesting limitations. Yet another requirement of the RF transceiver 240 is to support a communication range sufficient to operate in an electrical closet, e.g., 3-4 meters metallic reach environment. In another embodiment of the invention the range may reach up to a few tens of meters in an indoor environment. This enables the placing of SPPSs on individual devices, e.g., on machines in a production line of a factory, and a minimum number of bridge units in the area. The RF transceiver 240 preferably uses a standard PHY layer supporting, for example and without limitations, IEEE 802.15.4, and/or communication protocol, for example and without limitation, Zigbee. Use of such standards enables easy integration with existing systems that already include wireless hardware, for example and without limitations, smart meters.

According to the principles of the invention, each time a pulse arrives from the C2PC 214 an interrupt signal is sent to the MCU 220. Responsive to receiving the interrupt pulse the MCU 220 wakes up and increases the counter 227 value. The energy stored in each pulse is larger than the energy required for wakeup and counting, hence enough energy is still available for charging the energy harvester 216 and/or enable transmission using the RF transceiver 250. The value of the counter 227 is proportional to the total charge which went through the primary line 130, i.e., current integrated over time. The value in the counter 227, as well as other parameters, are saved in the system's memory 230. The MCU 220 is enabled to periodically check for a condition to transmit. Such a condition may be one or more of the following conditions: sufficient amount of energy exists, upon a certain time lapse from a previous transmission, upon collection of certain data such as significant or otherwise interesting data, and other relevant conditions. According to the principles of the inventions detection of the existence of sufficient amount of energy for transmission, for example, through the A/D converter 226 connected to the energy harvester 216, it is possible to detect if its voltage reached a predetermined value.

Upon determination that a transmission is to take place the MCU 220 prepares a message to be transmitted. The message is typically a single packet of data that may contain various types of information and include the SPPS's unique identification (UID) which enables a management unit to positively associate the current data received with previous data handled by the management unit with respect of the SPPS. The value of counter 227 value, potentially multiplied by a calibration factor converting that value into a normalized charge unit relative to other sensors, for example, Ampere-Hour (AH), may be attached as part of the packet. The calibration factor may be programmed to the SPPS 110 in the NVM of memory 230 during calibration of the circuit 200, as part of final inspection during manufacturing. This ensures compensation against inaccuracies typical to the manufacturing process. The calibration factor may be a fixed value for all units or a specific calibration factor unique to each unit. The latter is useful for overcoming production tolerances of the SPPS. Other information may include, without limitations, various SPPS status information, hardware version, software version, alerts such as overload, phase information, average current, temperature, time duration information, power off indication, e.g., upon identification that the load was turned off, and other system parameters. Such parameters may be saved until such time of transmission in memory 230, and more specifically in a NVM portion of memory 230. A cyclic redundancy code (CRC) calculation, forward error correction (FEC), and/or data redundancy may be further added to a packet for data validation at the receiver side. In one embodiment, when the voltage of the harvesting circuitry is determined to be decreasing at a high rate, i.e., the power line load was turned off, the device transmits a message containing the last counter value as no energy may be available until the load is switched on again.

When condition(s) to transmit is (are) met, the MCU can implement a carrier sense multiple access (CSMA) mechanism for the purpose of collision avoidance. The following steps are therefore taken. First, the receiver of the RF transceiver 240 is switched on. Second the receiver senses whether there are currently other transmissions. This is particularly important in the environment in which the SPPS operates, which is an environment rich with SPPSs, possibly a few hundreds of them. Third, upon determination that the air is free, the receiver is disabled and the transmitter of the RF transceiver 240 is enabled for transmission to send the information message; otherwise, the receiver us disabled and the circuit 200 is caused to sleep for a random time interval, after which the circuit 200 wakes-up and the sequence of steps is repeated until the desired transmission is completed. In one embodiment of the invention, after completion of transmission the transmitter is disabled and the receiver is enabled to receive an acknowledgement signal from the management unit. In another embodiment of the circuit 200 the information messages are short enough and the intervals between transmissions are long enough so that collisions are highly unlikely. In such an embodiment the transmission of the information message may take place without pre-sensing of the air, thereby conserving energy. In yet another embodiment of the invention, after transmission the receiver is activated to receive a clock synchronization signal. This allows synchronization between the clocks of MCU 220 and the management server 1050 (see FIG. 10), and as further explained herein below.

In yet another embodiment of the invention sufficient amounts of energy are available in the circuit 200 for continuous or longer operation. This is possible in cases where the primary current is above a certain value. The MCU 220 can then remain on and perform signal processing on the non-rectified signal coming directly from the current transformer 212. The gathered information may be therefore transmitted more frequently. This is useful for example for measurements relating to peak values, average currents, phase calculation, frequency shift calculation, transient and irregular current over short period of time, and total harmonic distortion (THD). The reservoir voltage of energy harvester 216 is constantly measured by means of A/D converter 226 of MCU 220, in order to prevent overcharge. If necessary a discharge of the energy harvester 216 is performed through an I/O port. The voltage information further provides an indication of the available energy for keep-alive transmissions when no primary current exists. This may happen when the circuit breaker 120 tripped or was otherwise shutdown, or otherwise when no power is consumed by the electrical sub-network protected by the circuit breaker 120. In a further embodiment of the invention a 3-phase SPPS is implemented comprising three analog sections 210 each coupled to a single MCU 220, which is further coupled to the transceiver (240) and an antenna (250). The circuit is configured to handle three analog sections such that the single MCU 220 can handle the entire operation of a 3-phase SPPS. While a 3-phase SPPS is described it should be understood that a system comprising a plurality of analog sections may be implemented, for a single phase or multiple phase SPPS, thereby reducing the costs of such a multi-power-line-sensor SPPS.

Figure 3:
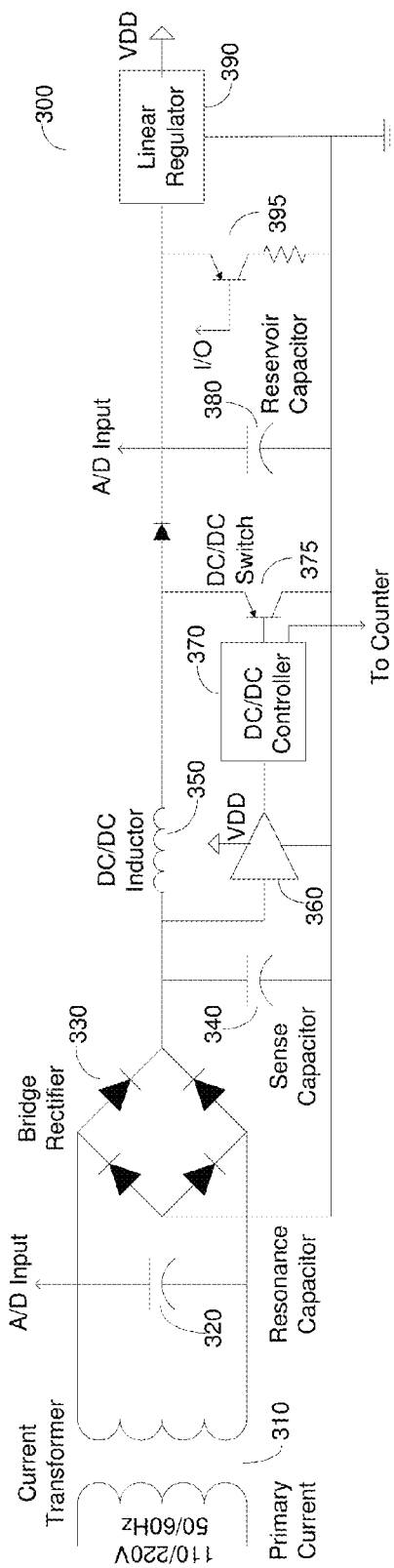
FIG. 3 is a circuit diagram of a first embodiment of the analog portion of the self-powered sensor in accordance with the invention.

Reference is now made to FIG. 3 depicting an exemplary and non-limiting circuit diagram 300 of a first embodiment of the analog portion 210 of the self-powered circuit 200 in accordance with the invention. The primary winding of the current transformer 310 is the power line 130 and its AC current induces voltage and current in the current transformer 310. The induced current resonates with the resonance capacitor 320 to produce sufficient voltage to pass through the diode bridge 330. In the case where Schottky diodes are used this voltage is approximately 0.3V. At the output of the diode bridge a rectified DC current is provided which charges the sense capacitor 340 until it reaches a certain threshold $V_{1H}$. The comparator 360 detects $V_{1H}$ on the sense capacitor 340, and produces a control signal to the DC/DC controller 370 which in turn activates the DC/DC switch 375 and boosts the voltage on the high capacitance reservoir capacitor 380 to a high voltage $V_2$, typically up to 12V. The control signal is also used as an interrupt to wake up the MCU 220 and raise a counter 227. Each discharge of the sense capacitor 340 represents a quantum of AH flowing through the main circuit. The frequency of the pulses is proportional to the primary current and the number of pulses is therefore proportional to the total AH flowing through the main circuit. The sense capacitor 340 is discharged through the DC/DC inductor 350 into the reservoir capacitor 380. The DC/DC control signal from the DC/DC controller 370 causes suspension of the discharge of the sense capacitor 340, once the comparator 360 detects a low threshold $V_{1L}$, for example 0.5V, on the sense capacitor 340. The voltage of the reservoir capacitor 380 is regulated by the linear regulator 390 into a steady DC voltage, for example 3.3V or 2V as the case may be, which is supplied to the MCU 220, RF Transceiver 240, DC/DC controller 370 and the comparator 360.

Upon startup of circuit 300 the reservoir capacitor 380 is charged by the sense capacitor 340 until enough energy is stored in the reservoir capacitor 380 that provides a sufficient voltage to activate the comparator 360 and the DC/DC controller 370. The advantages of using a DC/DC converter are twofold: enabling the boosting of the reservoir capacitor 380 into a high voltage, hence enabling an energy reservoir sufficient for many RF transmission cycles; and, enabling a relatively low $V_{1H}/V_{1L}$ range, hence enabling the circuit 300 to operate at very low primary currents by producing, typically, only up to 1V at the sense capacitor 380. The voltage of the reservoir capacitor 380 is provided to the A/D converter 226 of the MCU 220 thereby enabling an intentional discharge to prevent overcharge. Discharge is achieved by the MCU 220 through control of the I/O terminal of transistor 395. In another embodiment, as also previously discussed, a Zener diode (not shown) is used for the purpose of overcharge control. In another embodiment the A/D converter 226 is configured to detect if the load connected to the primary line was turned off and hence consumes zero current. In this case the voltage on the reservoir capacitor 380 drops at a high rate as no energy is supplied to the circuit 200. The transmitter therefore transmits a single message indicating that power was turned off. The message may further contain the last counter value sampled prior to the reservoir energy depletion. The non-rectified output of the current transformer 370 is coupled to the A/D converter 245 of the MCU 380, for example using a small sense resistor (not shown) thus enabling additional signal processing and measurements when enough energy exists in the circuit 300. For example, and without limitations, phase measurement or detection of irregular behavior may be achieved at such times. By limiting the voltage of the sense capacitor, the voltage on the CT 310 coil is kept low hence the magnetic core can be operated below its natural saturation point which increases the measurement accuracy.

The resonance capacitor 320 resonates with the current transformer coil in order to produce a sufficiently large voltage to pass through the diode rectifier. Since the magnetization curve of a typical core is nonlinear at low primary currents, the effective inductance of the core varies with primary current. In one embodiment of the invention, it is beneficial to select the resonance capacitor's value so that maximum resonance is achieved at low primary currents. This produces the required voltage swing to pass through the diode bridge even at very low primary currents.

Figure 4:
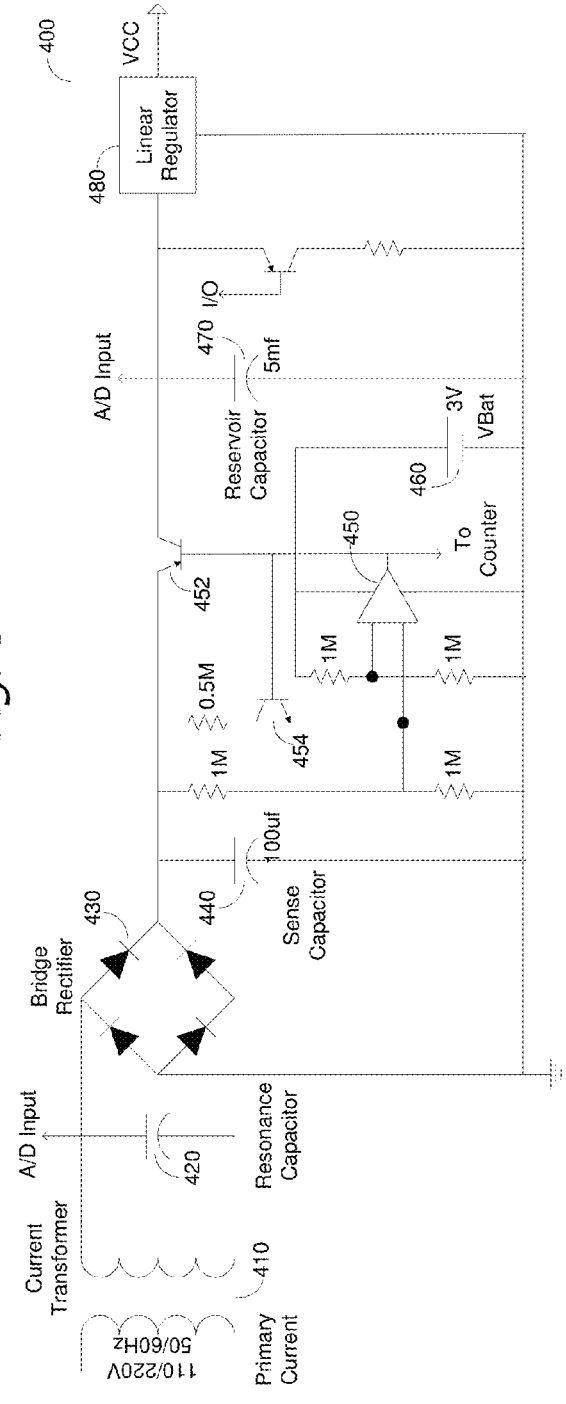
FIG. 4 is a circuit diagram of a second embodiment of the analog portion of the self-powered sensor in accordance with the invention.

FIG. 4 depicts an exemplary and non-limiting circuit diagram 400 of a second embodiment of the analog portion 205 of the self-powered sensor 110 in accordance with the invention. The circuit is simpler then the circuit 300 as it does not use a DC/DC controller. In this embodiment, when the sense capacitor 440 reaches 3V, the comparator 450 activates the switches 452 and 454. Activation of the switch 452 enables charging the reservoir capacitor 470 directly from the sense capacitor 440. The switch 454 changes the comparator 450 thresholds. When the sense capacitor 440 is discharged to 2.2V the comparator disengages the capacitors, i.e., transfer of energy to the reservoir capacitor 470 ceases. The voltage on the reservoir capacitor 470 is regulated to, for example, 2V, the voltage which is the $V_{CC}$ voltage of the MCU 220 and the RF transceiver 240. In many cases, the internal voltage regulator of the MCU 220 may be used since the voltage range is minimal. When the voltage of the reservoir capacitor 470 voltage is above, for example, 2V, the MCU 220 is capable of waking up and drawing current for pulse counting and transmission as described above. The MCU 220 enables the reservoir capacitor 470 to be charged to a peak voltage of, for example, 2.2V. Overcharge is prevented by intentional discharge as described in the previous embodiment. In this case, since no DC/DC is used, it is critical to keep the voltage of the reservoir capacitor 470 lower than the low threshold of the sense capacitor 440, for example, 2.2V, in order to prevent charge from flowing backwards. In another embodiment, as also previously discussed, a Zener diode (not shown) is used for the purpose of overcharge control. An optional small auxiliary battery 460 is used in order to feed the comparator 450, provide initial operating energy when the reservoir capacitor 470 is not fully charged, and provide enough energy for low frequency, for example once per day, keep-alive transmissions when no primary current exists. Keep alive transmissions are important in order to notify the system of the existence of the sensor even when no primary current exists.

Figure 5:
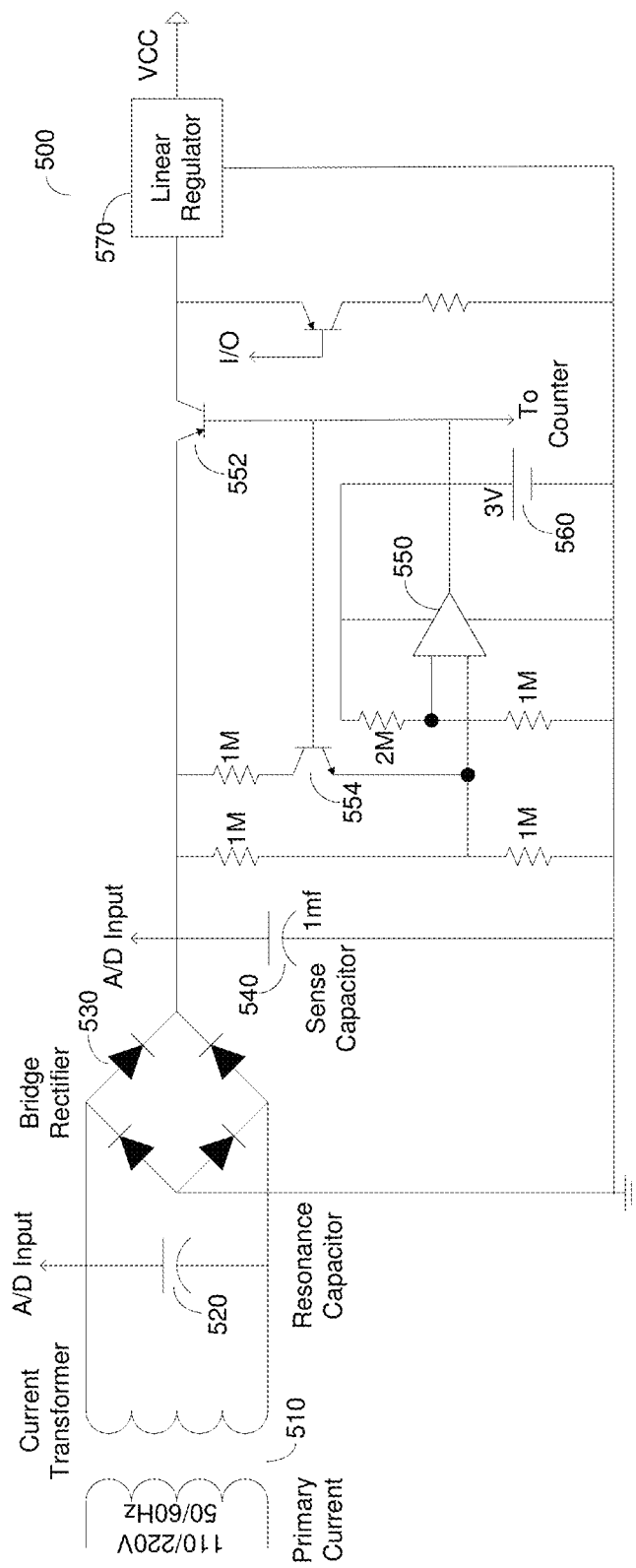
FIG. 5 is a circuit diagram of a third embodiment of the analog portion of the self-powered sensor in accordance with the invention.

FIG. 5 depicts an exemplary and non-limiting circuit diagram 500 of a third embodiment of the analog portion 205 of the self-powered sensor 110 in accordance with the invention. In this embodiment of the analog portion 205 there is only one large sense capacitor 540 and no reservoir capacitor nor a DC/DC controller. The reason for using lesser components in the circuits shown in FIGS. 4 and 5 is to reduce the component count and thereby reduce the bill-of-materials (BOM) of the solution. In the circuit 500 the sense capacitor 540 also functions as the energy source for, typically, a single transmission. Therefore, the sense capacitor 540 of this embodiment is designed with a rather large capacitance, for example 1 mF. According to the principles of operation of the circuit 500 the comparator 550 detects when the sense capacitor 540 is charged, for example, up to 4V, and opens the switch 552 towards the linear regulator 570. The linear regulator 570 provides a regulated voltage, for example a 3V output, thereby allowing the MCU 220 to draw current resulting in discharge of the sense capacitor 540. Due to the activation of switch 554, discharge to a lower reference voltage, for example 3V, is detected by the comparator 550 and discharge is stopped. The MCU 220 is enabled to perform operations which discharge the sense capacitor 540 to perform the counting operation and transmission when needed. The MCU 220 is further enabled to measure the voltage of the sense capacitor and discharges it down to a lower voltage, for example 3V, intentionally when performing operations that do not consume the entire energy. An optional battery 560 is used to provide a reference voltage to the comparator 550, as well as to allow keep-alive transmissions when the primary current is below a minimum detectable current. In another embodiment, as also previously discussed, a Zener diode (not shown) is used for the purpose of overcharge control. In another embodiment, as also previously discussed, a linear regulator is not used and the MCU's internal regulator regulates the input voltage.

In another embodiment of the invention, power measurement is done by measuring the voltage change rate on the sense capacitor, e.g., capacitors 540, 440 or 340. The sense capacitor voltage is measured by A/D 226. The MCU 220 then lets the capacitor discharge through a resistor, for example resistor 395, for a fixed period of time, during which the MCU 220 can be set to a low power mode. The voltage level of the sense capacitor is measured after the elapse of the fixed period of time, and the voltage difference (ΔV) between the two measurements is calculated. ΔV consists of a negative fixed part, i.e., the voltage discharge through resistor 395, plus a positive variable part proportionate to the charge rate of the capacitor due to the primary current flow.

Key to the operation of the SPPS 110 is that it is capable of addressing several critical challenges to its successful operation. Three key issues are the minimum power detection of the current transformer 212, the power balance of the circuit 200, and wireless coexistence in an environment of a plurality of SPPSs 110 that may include several hundreds of SPPSs. In order for an SPPS 110 to be a useful device it is necessary that it be capable of detecting as low as possible currents flowing through the primary lead 130. The design must take into consideration the limited space typically available for an apparatus such as, but not limited to, SPPS 110 that must fit dimension restrictions of the circuit breaker 120. In other embodiments of the invention other size restrictions may apply, however these should not be viewed as limiting the scope of the invention. Inductance of the secondary winding is approximately:

$$L = \frac{\mu_0 \mu_r N^2 A}{l}$$

Where N is the number of windings, $\mu_r$ is the relative permeability of the magnetic material, such as, and not limited to, strip wound iron, $\mu_0$ is the permeability of free space, A is the cross section of the core, further discussed with respect of FIGS. 6 and 7 below, and l is the effective length of the core. For N=1500, $\mu_r$=1000, $\mu_0$=4π10$^{-7}$, A=40 mm$^2$, and l=20 mm, the inductance is L=5.5 Hy. The current ratio between the secondary current $I_S$ and the primary current $I_p$ is approximately, for an ideal transformer, $I_p/I_S$=N. The voltage on the secondary coil is given by $V_S$=$I_S$ωL=$I_p$ωL/N, and at f=50 Hz ω=2πf=314 rad/sec. Therefore, $V_S$=$I_p$ωL/N=1.15 $I_p$. Assuming a 1V drop over the diode rectifier, for example diode rectifier 330, and charge voltage of 1V then at least 2V are needed in order for the system to operate. Hence, there is a minimum detectable current of 2/1.15=1.7 A peak=1.2 A RMS. Using the resonance capacitor, for example resonance capacitor 320, the impedance is decreased by a factor of $1/(X_L-X_C)$ where $X_L$ is the impedance of the core and $X_C$ Is the impedance of the resonance capacitor. Taking an accumulative tolerance of ±20% for the capacitance and inductance, results in a worst case of 40% increase in signal, and hence the minimum detectable current is, in this exemplary case, 1.2×0.4=0.48 A, which represents a minimum detectable power of 105 VA at 220V. At 110V 60 Hz, the minimum detectable current in the exemplary case is 5/6×0.48=0.4 A and a minimum detectable power of 44 VA. Since L is proportional to N$^2$ and to A and V is proportional to 1/N, the minimum detectable current may be decreased by increasing either N or A. However, it is essential to ensure that the entire core, and its respective secondary winding, fit in the size constraints of SPPS 110, and an increase of N or A may have a material effect thereon.

Furthermore, to make the SPPS 110 an operative device it is essential to ensure that a sufficient amount of power may be made available through the operation of the circuits discussed hereinabove. Following is an exemplary and non-limiting analysis thereof. Firstly it is essential to understand the energy requirements of each of the key components: the transmission cycle, the counting cycle and the logic operation. Failure to address these issues may result in non-operative circuits. In all cases the assumption is for a 3V operation. For the transmission cycle a transmission current of 20 mA is used for a period of 5 mSec. A processing current of 1 mA is used during a 10 mSec period of wakeup and processing. Therefore the total energy requirements for the transmission cycle is: 3V×(20 mA×5 msec+1 mA×10 msec)=0.33 mJ. For the counting cycle a processing current of 1 mA is used for a wakeup and processing period of 5 mSec. Therefore the energy requirements for this counting cycle are: 3V×1 mA×5 msec=15 μJ. Lastly, the logic operation requires a continuous current of 50 μA, resulting in a continuous power consumption of: 3V×0.05 mA=150 μW. The total energy has to be supplied reliably by the power supply circuit, for example, circuit 300. It is therefore necessary that the sense capacitor, for example sense capacitor 340, and the reservoir capacitor, for example reservoir capacitor 380, provide sufficient energy for the performance of the desired operations. The above assumptions are typical for common low power MCUs and radio frequency integrated circuits (RFICs).

To address the energy balance of the circuit 200 it is necessary to ensure that the sense capacitor, for example sense capacitor 320, is capable of supplying sufficient energy for the counting cycle and that the reservoir capacitor, for example reservoir capacitor 380, is capable of supplying enough energy for several transmission cycles. Both are addressed in the following exemplary and non-limiting calculations. If the sense capacitor $C_1$ is equal to 1 mF and is charged to $V_1$=1V and discharged to $V_2$=0.5V, then the total discharge energy is: E=0.5 $C_1$×($V_1^2$-$V_2^2$)=375 μJ. It has been shown hereinabove that the counting cycle requires 15 μJ which is less than 3% of the available energy. The remaining energy is accumulated for the purposes of transmission, for example, in the reservoir capacitor. Assuming a reservoir capacitor, for example capacitor 320, having a value of 0.375 mF, the capacitor being charged to $V_1$=5V and discharged to $V_2$=3V, then the total energy is: E=0.5 $C_2$×($V_1^2$-$V_2^2$)=3 mJ. A previous calculation has shown that the transmission cycle consumes around 0.33 mJ and hence roughly nine transmission cycles are possible under these conditions. Now it is possible to determine the number of counting cycles it takes to charge the reservoir capacitor with the required amount of energy. The available energy is 360 μJ and with a 50% DC/DC controller efficiency there are 180 μJ at every sense capacitor pulse. By dividing the amount of energy required for several transmission cycles, e.g., 3 mJ, by the amount of energy charged each cycle, e.g., 0.18 mJ, it is determined that approximately 17 sense capacitor cycles are needed to charge the reservoir capacitor with the required energy.

In order to ensure proper operation of the circuit 200 it is necessary to ensure a positive energy balance for continuous system operation even at the lowest primary currents. It is therefore necessary to calculate the power in to the system versus the power out of the system, the later having to be smaller than the earlier. For the power in, at a primary current $I_p$=0.5 A and N=1500 results in a secondary current of $I_S$=0.33 mA. Using the same figures as above, i.e., a sense capacitor of 1 mF, discharge voltage down to 0.5V and charge voltage of 1V, the charge time is $T=C\Delta V/I_S=1.5$ Sec. The available energy of 375 μJ therefore provides 375/1.5=0.25 mW. Assuming 80% DC/DC efficiency, the available power in is 200 μW. The power out is a combination of the continuous logic operation, the counting process and the transmissions. The continuous logic operation requires 150 μW as shown above. The counting processing requires 15 μJ for a period of 375 mSec which is equivalent to 40 μW. Assuming a transmission once every one minute then 360 μJ are required every 60 seconds which are 6 μW. The total power consumption is therefore 196 μW which is less than the 200 μW available as explained herein above. It should be noted that a higher primary current results in an improved power balance that enables an increase of the transmission frequency, performing continuous signal processing, storing energy for times when no primary current exists, and combinations thereof.

Figure 6:
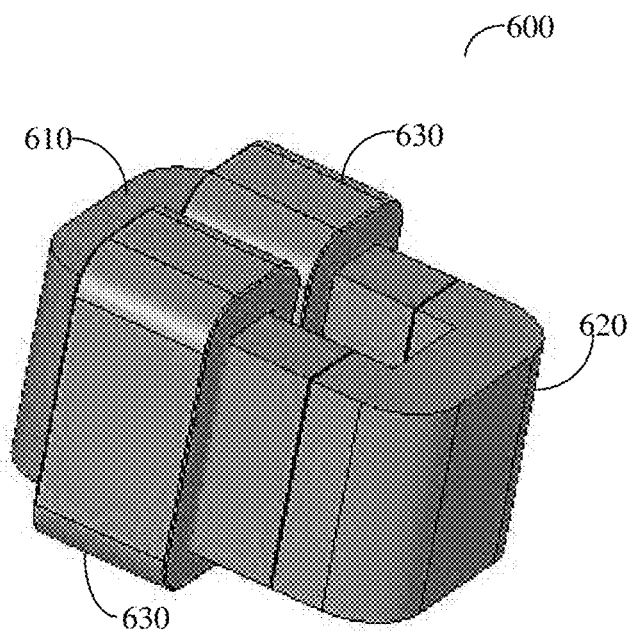
FIG. 6 is a schematic diagram of a core with the secondary winding.
Figure 7:
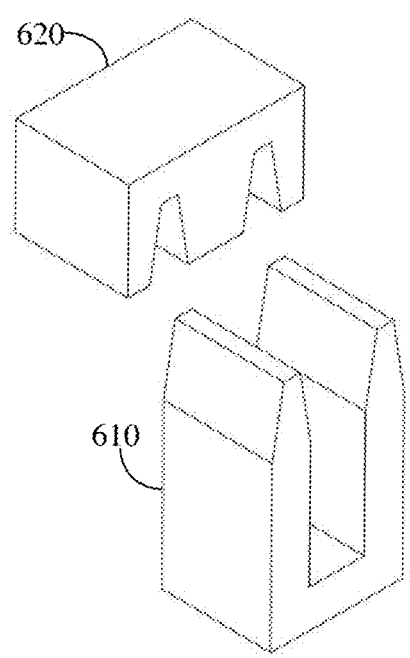
FIG. 7 is a schematic diagram of the two parts comprising the core.
Figure 8:
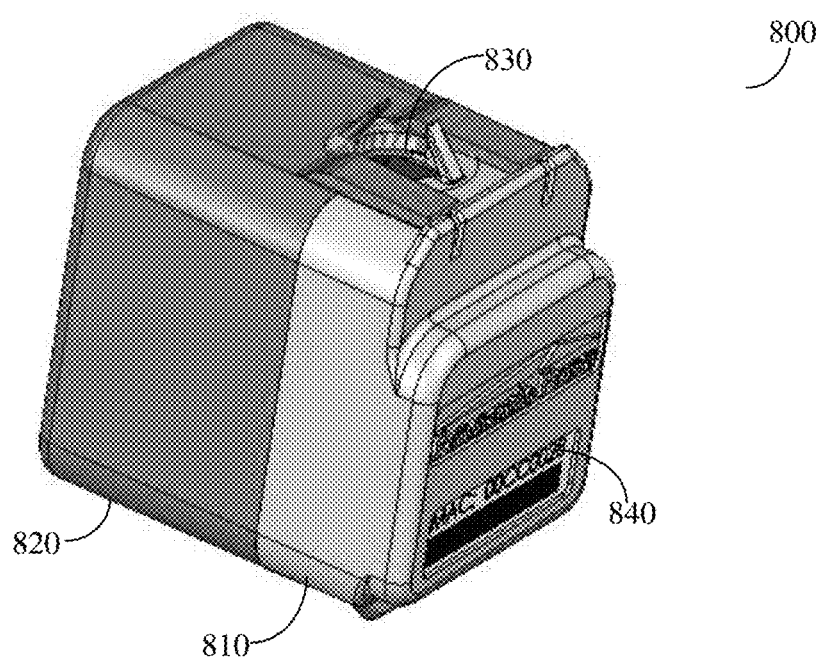
FIG. 8 is a schematic diagram of a housing of a self-powered power sensor implemented in accordance with the invention.

FIGS. 6 and 7 show schematic diagrams 600 and 700 of a core with the secondary winding and the core separated into two parts. The core is comprised of two parts 610 and 620 that are separable from each other, however, as shown in FIG. 7, are designed so as to ensure that when they are assembled they provide good magnetic flow through the core by reducing the air-gap between the two parts to minimum, for example 10 μm. While an exemplary shape of the two portions of the core is shown these are merely for explanation purposes and other designs are possible to achieve the required results. It is essential, as explained herein above, that the core fit in the dimensions allotted in the SPPS 110 so that it can properly fit in an electricity closet in conjunction with a circuit breaker. The secondary windings 630 of the current transformer 212 are wound on one of the sections of the core, for example, section 610 which is the stationary section that is placed in the exemplary and non-limiting housing 800 shown with respect of FIG. 8. In this example, these may be two windings connected in series, of two independent secondary windings (see FIG. 6). The moveable section of the core, for example section 620, is placed in section 810 of the housing 800 which is separable from section 820 of the housing, in which section 610 is placed. When separating section 810 from section 820 it is possible to place them around power line 130 so that when the sections 810 and 820 are reconnected the power line 130 is placed within the core perimeter thereby completing the current transformer 212. Each SPPS 110 is assigned a unique identification (ID), for example a MAC address that may be 16 bytes in length, that is placed on the housing 800 at, for example, location 840. At installation of the SPPS the MAC address is read by a technician installing the system for configuration purposes. In one embodiment machine readable code is provided, e.g., barcode, to enable automatic reading using a reader. While a core comprising of two sections is described hereinabove, it should be noted that other implementations for a core are possible without departing from the scope of the invention. In one embodiment a single section core is used and in such a case the primary line must be inserted through the hole in the core. It may require disconnection of the line and threading it through the core for mounting the SPPS device.

Figure 9:
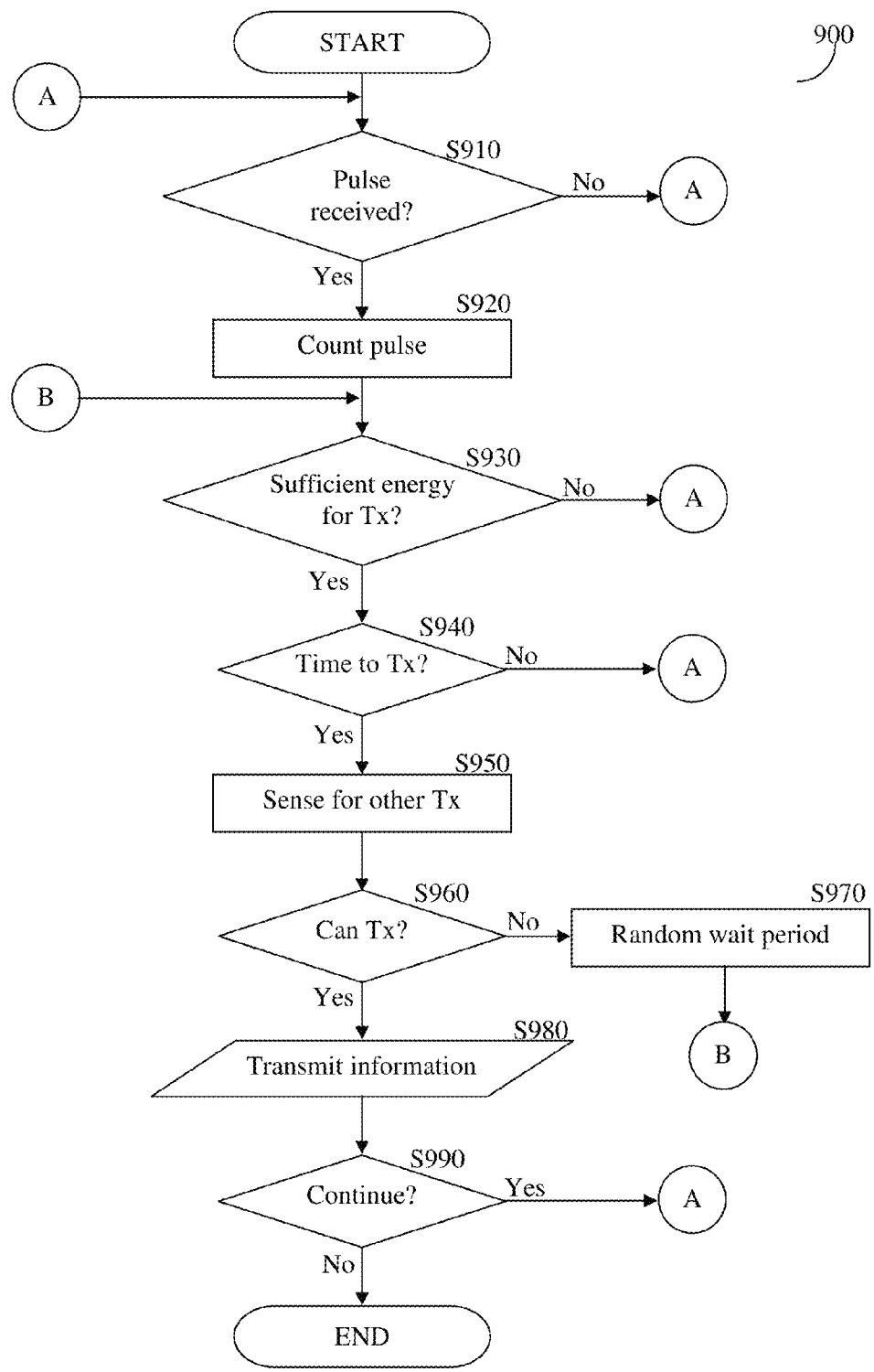
FIG. 9 is a flowchart of the operation of a self-powered power sensor deployed in accordance with the invention.

An exemplary and non-limiting flowchart 900 depicted in FIG. 9 describes the operation of a SPPS deployed in accordance with the invention. In S910 the SPPS, for example, SPPS 110, checks if counting pulse was received and if so execution continues with S920; otherwise, execution continues with S910. In S920 a count is performed in accordance with the principles described herein above, which may include the discharge of the sense capacitor, for example capacitor 320. In S930 it is checked whether there is sufficient energy to perform a transmission and is so execution continues with S940; otherwise, execution continues with S910. In S940 it is checked whether it is time to transmit by the SPPS 110 and if so execution continues with S950; otherwise, execution continues with S910. In S950 SPPS 110 senses the environment for another transmission to avoid transmission collisions as discussed herein above. In S960 it is checked if it is possible to transmit and if so execution continues with S980; otherwise, in S970 a random wait period is determined and execution then continues with S930. In S980 the information gathered by the SPPS 110 is transmitted, the information transmitted contains data as discussed herein above. In S990 it is checked whether the operation should continue and if so execution continues with S910; otherwise, execution terminates. An optional step may be added after transmission is complete for the purpose of reception of feedback information from the unit receiving the information sent by the transmitter. Such feedback information may include, but is not limited to, acknowledge information and/or synchronization information.

Figure 10:
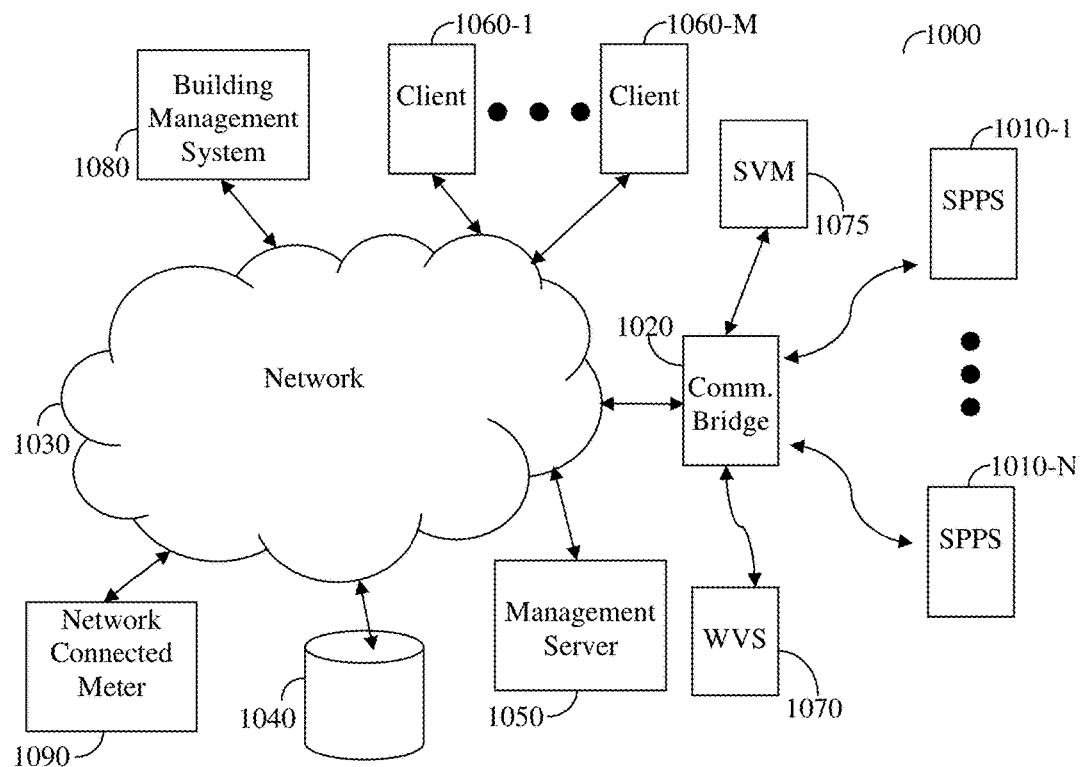
FIG. 10 is a schematic diagram of a system configured in accordance with the invention.

Reference is now made to FIG. 10 where an exemplary and non-limiting system 1000, configured in accordance with the principles of the invention, is shown. The system comprises a plurality of SPPS 1010 communicatively coupled to a communication link 1020. The SPPS 1010 may be placed in an electrical closet before or after respective circuit breakers or, at the input to specific power consuming units. The management server is equipped with a transceiver enabling the communication with the plurality of SPPS 1010 using one or more of the communication schemes discussed herein above. The communication bridge 1020 is configured to communicate with those SPPSs 1010 it is configured to operate with, using for identification their respective MAC addresses. The communication bridge 1020 is coupled to a network 1020 which may be, but is not limited to, a local area network (LAN), a wide area network (WAN), a metro area network (MAN), the Internet, the world wide web (WWW), the likes and combinations thereof. The communication link can be, but is not limited to, a WLAN (Wireless LAN), for example 802.11 also known as WiFi, a wireless sensor area network, for example 802.15.4 also known as Zigbee, power line communication (PLC), or a cellular to modem network such as GPRS or CDMA. In one embodiment of the invention the communication bridge aggregates the data from the plurality of sensors 1010-1 to 1010-N prior to sending it to the network. To the network there are coupled a database 1040 to accumulate data collected by the communication bridge 1020. The communication bridge 1020 may be placed in each closet and aggregate a plurality of SPPS 110 communications. In one embodiment the communication bridge 1020 is responsible for the phase calculation discussed in more detail herein below. Further coupled to the network is a management server 1050 that based on the data accumulated in database 1040 may provide a client 1060 processed information respective of the collected data as well as communicate with other application software, for example building management systems (BMSs). In one embodiment of the invention the minimum number of winding in the secondary coil is 500.

In one embodiment of the invention the communication bridge 1020 is enabled to provide information with respect to a phase and enable the system to calculate a phase shift. Knowledge of the phase shift between current and voltage is used to calculate the power factor (cos φ), hence determine more accurately the real active power flowing through the power line. When it is determined that there is sufficient energy in energy reservoir 216 then MCU 220 may become operative in continuous mode, for as long as such sufficient energy is available, or until operation is complete. Using AD converter 225 MCU 220 detects the peak current of the current transformer 212. The time of the peak relative to a clock synchronized between the sensor and the bridge unit is recorded and, when appropriate, transmitted to the communication bridge 1020, according to the principles discussed hereinabove. communication bridge 1020 is further enabled to detect the peak of the power supply voltage nearest to the sensors by at least a peak detector (not shown) coupled to the communication bridge 1020 and to a reference power line. The time of the peak of is recorded by the communication bridge 1020 continuously. As the clocks of the communication bridge 1020 and circuit 200 are synchronized, as further discussed hereinabove, it is now possible for the communication bridge 1020, upon receiving information from the circuit 200 respective of the measured peak and time, to determine the phase shift between the reference power line voltage and the current measurement made by the circuit 200. It should be noted that the use of a peak detector enables the system to become agnostic to the differences in the utility grid frequency, e.g., 60 Hz for the USA versus 50 Hz in Europe, as well as to any other error or change in the supply voltage frequency.

The communication bridge 1020 may be further configured to communicate wired or wirelessly with a standard voltage meter 1070 and/or a wireless voltage sensor 1070 respectively. In one embodiment of the invention a network connected meter 1074 may be used for the purpose of measuring voltage at a desired location. Such measurements may be used to further determine the power factor is explained in more detail herein below. The system 1000 may be further connected via the network 1030 to a building management system (BMS) that is used in a building to create a central computer control, monitor and optimization of facilities of the building such as, but not limited to, air-conditioning, lighting and security. The BMS allows for easier operation of facilities and enables the reduction of energy waste. It should be noted that the SPPSs 1010 shown in FIG. 10 may be replaced by an SPPS 1100 discussed herein below with respect of FIG. 11, without departing from the scope of the invention.

Figure 11:
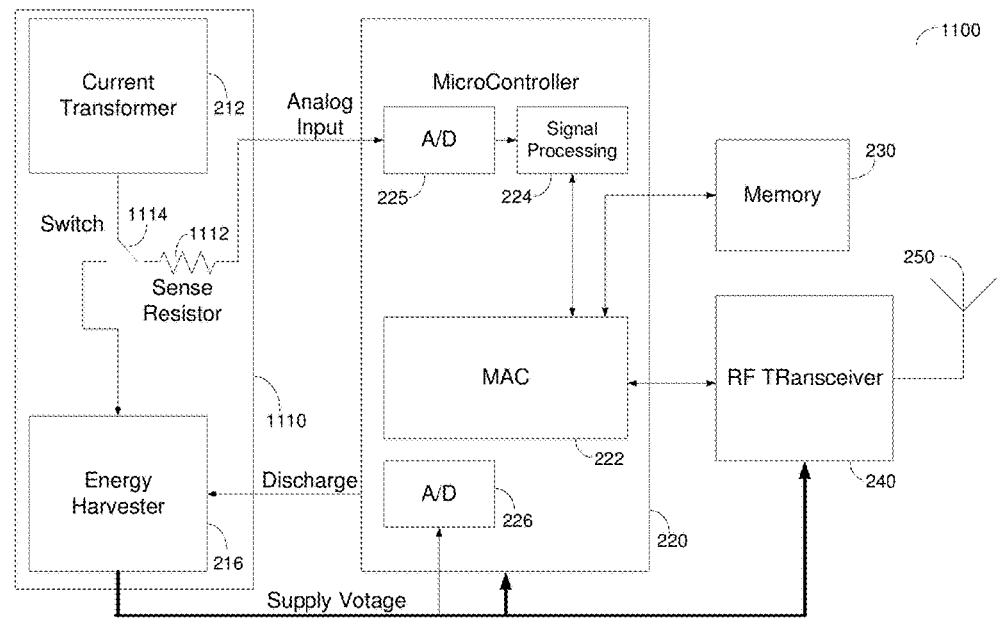
FIG. 11 is a block diagram of a second embodiment of a self-powered sensor in accordance with the invention.

Reference is now made to FIG. 11 where an exemplary and non-limiting second embodiment of a SPPS 1100 is shown. A key difference may be observed in the microcontroller 220 that does not receive a pulse as an interrupt signal as was shown in the previously described embodiments, for example in FIG. 2. Similar components to those of FIG. 2 are not further discussed herein, unless necessary for clarity. The notable change is in the analog section 1110 that comprises a current transformer 212, an energy harvester 216, a switch 1114 and a sense resistor 1112. In normal operation the switch 1114 is positioned to enable energy harvesting by the energy harvester 216. Periodically, for example under the control of the microcontroller 220, the switch 1114 is activated to short the secondary winding of transformer 212 through the sense resistor 1112, typically having a low resistance. The voltage on the sense resistor 1112 is sampled by the ADC 225. In order for the system 1100 to identify a voltage peak the process is repeated several times in each cycle. The switch 1114 is toggled between the two positions to enable energy harvesting most of the time in a first position, and measurement of the voltage periodically when in the second position. The sampling is averaged over a number of cycles and divided by the resistance value of the sense resistor 1112 to provide the current value. The current value is then multiplied by a time interval to obtain the total charge value, for example, in Ampere Hours. A calibration factor, as discussed herein above, can also be used with respect of system 1100.

Figure 12:
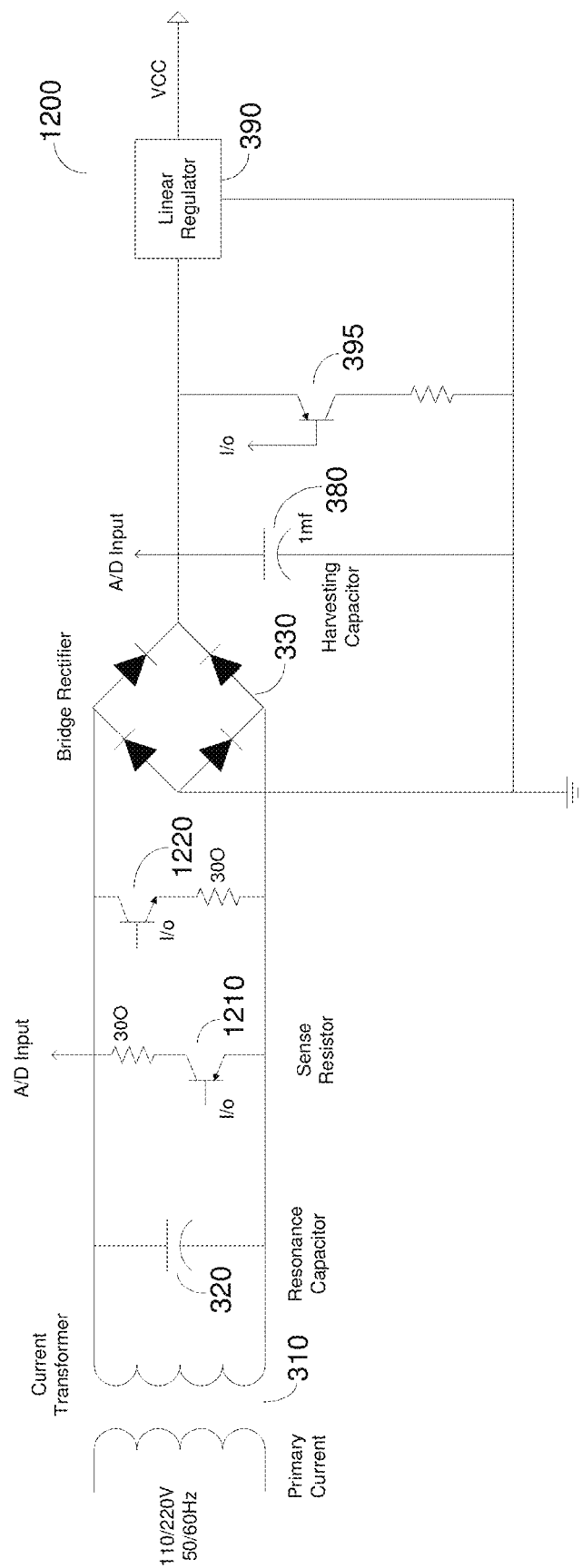
FIG. 12 is a circuit diagram of a fourth embodiment of the analog portion of the self-powered sensor in accordance with the invention.

The analog section may be implemented as shown in the exemplary and non-limiting circuit diagram 1200 of FIG. 12. Normally, the switches 1210 and 1220, connected between the resonance capacitor 320 and the bridge rectifier 330 are off, so that the harvesting capacitor 380 is charged. The voltage of the harvesting capacitor 380 is limited to avoid overcharge as discussed in detail herein above with respect to other embodiments of the invention. From an energy harvesting point of view, FIG. 12 represents an embodiment close to the one shown in FIG. 5 but embodiments similar to the ones shown in FIGS. 3 and 4, in terms of the harvesting circuitry, are also possible. To perform a measurement the microcontroller 220 switches the transistors 1210 and 1220 using their respective I/O ports. According to the principles of the invention switches 1210 and 12220 are operated simultaneously in opposite phases. Although measurement is preformed on a single resistor 300 rather than two, the use of the two switches and two resistors is in order to prevent DC load on the transformer 212. This is required to avoid saturation and distortion of the measurement results. It would be appreciated by those skilled in the art that one switch conducts in the positive part of the cycle, and the other switch conducts in the negative part of the cycle. It should be noted however that topologies using a single switch which can symmetrically conduct in both directions are possible, for example, by using a pair of MOSFET transistors connected in series. When the switches are active the current flows through the appropriate sense resistor instead of charging the harvesting capacitor 380. According to the invention, the sense resistors have a low impedance relative to the self resistance of the transformer coil. This enables a close to short circuit current flow, keeping the voltage across the resistor low enough thus maintaining minimal flux across the core and avoiding saturation of the transformer 212. In one embodiment of the invention, after switching on the sense resistors, the MCU 220 waits a certain time interval, typically a couple of hundreds of milliseconds, or switch to an off/power save mode, before performing the measurement, in order to allow for the resonance capacitor to discharge. This ensures high accuracy and better linearity of the measurement results. In accordance with the principles of the invention, in cases where it is possible to use two coils, a first secondary coil used to measure the voltage using the ADC 225 while the second secondary coil (see prior descriptions of FIGS. 6 and 8) is used for the purpose of energy harvesting, thereby eliminating the need for switching at the expense of a potential increase in size of the SPPS. The value of the sense resistor may be easily calculated. Assuming the SPPS is designed for a maximum primary current of 30 A then with N=1000 the maximum short circuit current of the secondary winding would be 30 mA. If the maximum input to the ADC 225 is 1V then the sense resistor 1112 is to be 30Ω. The resistance of a thin, e.g., 0.1 mm, copper wire with 1000 windings at typical dimensions of the SPPS is approximately 100Ω. Referring to the energy balance calculation explained hereinabove with respect to different embodiments, a similar amount of energy calculated before for the purpose of pulse counting, can be used here for the purpose of A/D activation and sampling, thus this embodiment does not significantly differ from the previous ones in terms of energy consumption. Therefore a sufficient amount of energy is available for proper system operation even when a very low primary current exists.

Figure 13:
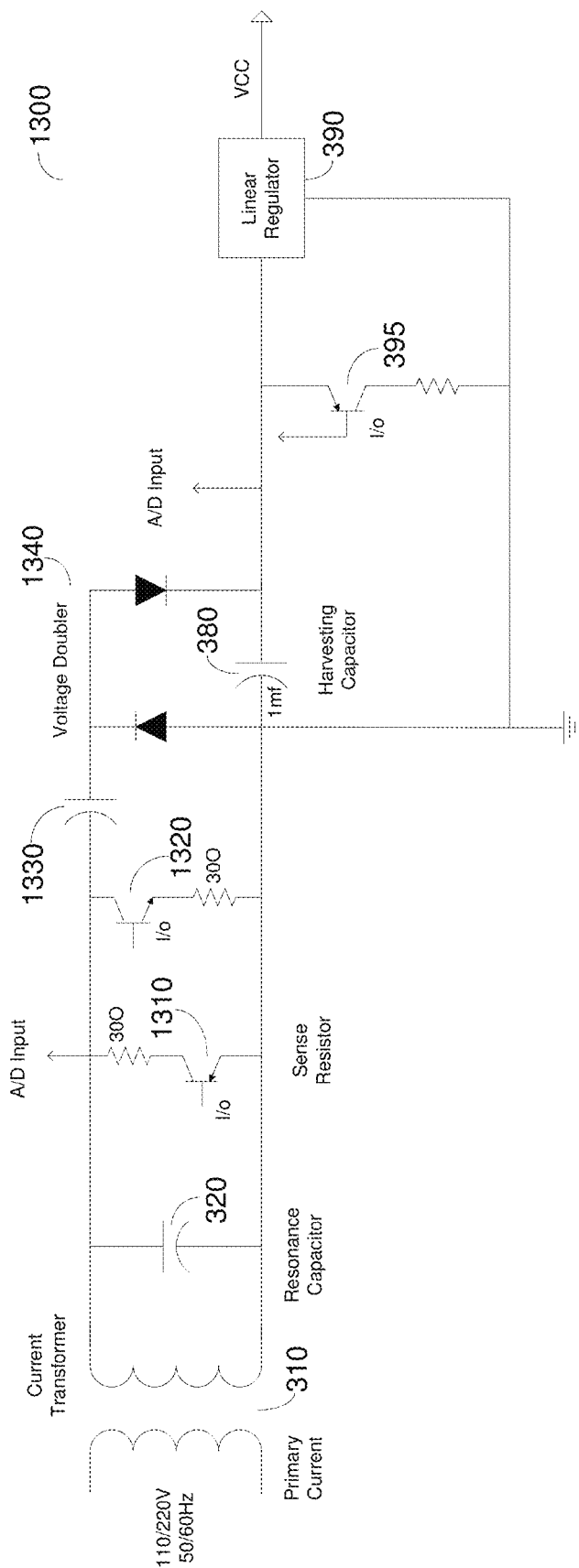
FIG. 13 is a circuit diagram of a fifth embodiment of the analog portion of the self-powered sensor in accordance with the invention.

In yet another exemplary embodiment of the analog section circuit 1300, shown in FIG. 13, a voltage doubler 1340 is used. In fact, the bridge rectifier described herein above with respect to all of the other embodiments can be replaced by a voltage multiplier. A person skilled in the art would readily note that the voltage multiplier may be a voltage doubler, tripler, quadrupler or any other type of passive voltage multiplier topology, without departing from the scope of the invention. The exemplary and non-limiting circuit 1300 shows a simple implementation of a voltage doubler 1340. The voltage on the harvesting capacitor 380 is double the voltage on the transformer 310 after resonance. In some cases the use of a voltage multiplier is advantageous at the lower current range. Also, specifically referring to the sense resistor topology, the voltage multiplier simplifies the grounding of the circuit as a common ground can be connected to the harvesting capacitor and the sensing resistor, whereas when using the bridge rectifier a differential voltage measurement needs to be made.

A person of ordinary skill in the art would readily appreciate that the invention therefore enables a very high granularity of measurement points of both current and voltage and hence overcomes significant challenges of prior art solutions. The wireless current transformer (CT) resides in the SPPS 1100 and provides the necessary data for the determination of the power factor as further explained in more detail herein below. For the measurement of the power factor simultaneous measurement of current and voltage is required, as the relative phase, or otherwise the relative position of the current and voltage signals is time, is necessary for such calculation. When both voltage and current signals are hardwired to the same device, as known from the prior art, it is trivial to measure the relative phase. However, when both measurements are not physically hardwired to the same device, as is in the case shown when wirelessly measuring at least one of the current or voltage, let alone both, an innovative approach is required.

Accordingly the following steps are suggested for operation with respect of the exemplary and non-limiting system 1000 described hereinabove with respect of FIG. 10. Normally, the SPPSs 1010 transmit a true root mean square (RMS) current value. The RMS current value is calculated in the system 1000 by checking every t interval if enough charge exists in the harvesting capacitor, e.g., capacitor 380, and if so switching from harvesting mode into sense mode where CT 310 is connected serially to the sense resistor 1210 as shown in FIG. 12; otherwise, wait an additional period in harvesting mode and repeat; then, wait a relaxation period in sense mode to discharge the resonance capacitor 310, typically in the range of ~150 mSec; Alternatively, the switching can be timed to the zero crossing of the signal to avoid the resonance capacitor discharge; Sample n periods of the secondary signal at a rate of Y samples per second, in the above sense mode (measuring the secondary signal over the sense resistor), where typical but non-limiting values are: every second, sample 5 periods at 64 samples per period; Upon completion of the samplings switch back to harvesting mode; and, Repeat the process described above N times or otherwise repeat until a timeout T elapses. Typical but not limiting values are 60 repetitions or until 1 minute passes. Subsequently, for each period sampled, the samples vector is used to calculate true RMS value of that vector; Averaging the RMS values where there are n×N values; Optionally, multiply the result by a calibration factor, or operate other calibration function(s), to obtain the required units, e.g., primary amp, milliamp, etc.; Checking if enough energy exists to transmit by sampling the reservoir capacitor and if so transmitting the result which is representing of the average current; Optionally, a carrier sense mechanism, e.g., 'listen before talk', is used to check if the air is free for transmission as described in the exemplary and non-limiting FIG. 9; otherwise, waiting for another period in harvesting mode and repeating the check.

Figure 14:
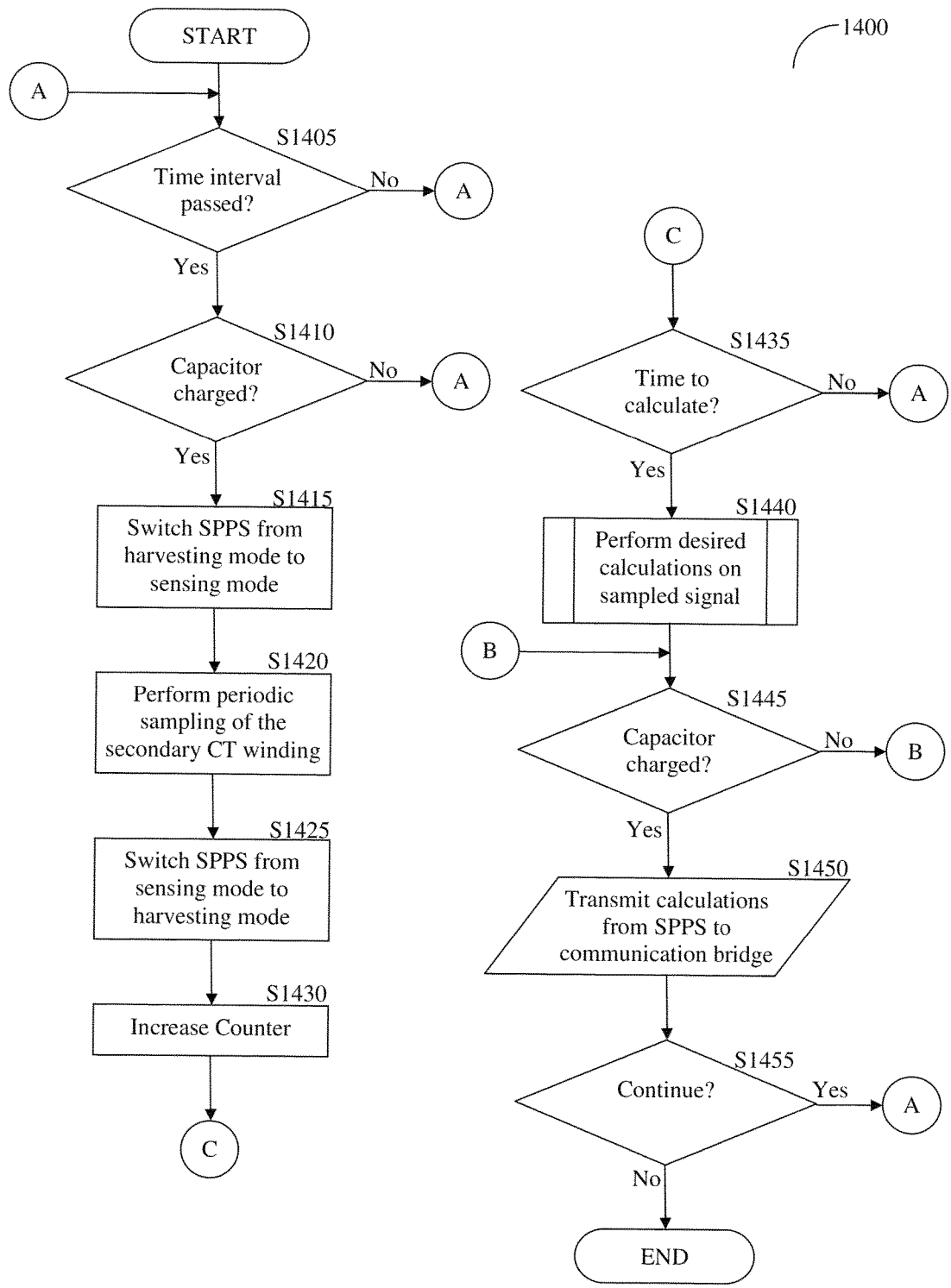
FIG. 14 is a flowchart describing the operation of a self-powered sensor in accordance with an embodiment of the invention.

FIG. 14 depicts an exemplary and non-limiting flowchart 1400 that describes the operation of a SPPS 1100 in accordance with an embodiment of the invention. In S1405 it is checked whether the required time interval has passed and if not the loop contains until such time that the period has passed and execution can continue with S1410. In S1410 it is checked if the charge capacitor of the energy harvester 216, shown in FIG. 11 has a sufficient energy stored therein and if so execution continues with S1415; otherwise, execution continues with S1405. In S1415 the SPPS 1100 switches from harvest mode to sense mode using switch 1114 and then there is a wait for a predefined relaxation period to discharge the resonance capacitor. In another embodiment, it is possible to detect zero crossing of the signal and not require the relaxation period without departing from the scope of the invention. In S1420 a sampling of the signal received from the secondary winding of the CT 212 is repeated 'n' times at a rate of 'y' samples per second so that an integer number of periods or half periods is sampled exactly. In S1425 the SPPS 1100 switches back to harvesting mode, i.e., the switch 1114 disconnects the connection to the sense resistor 1112 and connects to the energy harvester 216. In S1430 a counter (which, while not shown for simplicity was initialized, for example, to a value of '0') is incremented. In S1435 it is checked if it is time to perform the calculation by checking whether the time from the beginning of the process is larger than a predetermined time T or if the counter value is larger than a predetermined value 'N' and if so execution continues with S1440; otherwise, execution continues with S1405. Such returns allows to maintain a constant time interval between transmissions as well as limiting the number of samples to avoid memory overflow in the SPPS. In S1440 calculations are performed with respect of the plurality of samples gathered by the SPPS 1100, and as further detailed hereinabove in the exemplary cases, and may include calculations such as true RMS, average RMS values, calibration of the results, and the likes. It should be noted that while calculations are shown to be performed in S1440 it is possible to perform at least some calculations each subsequent to S1425 on a per-sample level without departing from the scope of the invention. This may include, for example, performing the RMS calculation of each sampled vector. In S1445 it is checked whether the reservoir capacitor of the energy harvester 216 has sufficient energy stored therein for transmission and if so execution continues with S1450; otherwise, execution continues to wait at S1445 until such time that the capacitor is sufficiently charged to allow for proper transmission. In S1450 a transmission of the calculated results takes place at the RF transceiver 240. Optionally, a carrier sense mechanism, e.g., 'listen before talk', is used to check if the air is free for transmission as described in the exemplary and non-limiting FIG. 9; otherwise, waiting for another period in harvesting mode and repeating the check. In S1455 it is checked whether it is necessary to continue and if so execution continues with S1405; otherwise, execution terminates. It should be noted that in some embodiment S1455 is not actually implemented and execution continues with S1405 immediately subsequent to S1450, and without departure from the scope of the invention. It is noted that although not shown in flowchart 1400 it is possible that various other types of transmissions and processes take place in SPPS 1010. These may happen throughout the process at different time intervals and may include, but are not limited to, management and state parameters, other types of measurements the SPPS may be able to perform, for example time measurement, current on/off condition, current change indications, temperature indications, device management data, current data in different forms etc., some of which are further described herein below in greater detail.

According to the principles of the invention the SPPS 1010 transmits a time synchronization signal based on the time of its internal clock every time interval. This time interval should be chosen to take into account the internal drift in the SPPS 1010 clock, so that it is smaller than the allowed error in the current to voltage phase measurement required. For example, if the drift is 100 μSec/minute, and the required phase error is ~0.5%, which is ~100 μSec in a 20 mSec period of 50 Hz, the synchronization message should be sent at least once every minute. The communication bridge 1020 includes a real time clock (RTC) mechanism either through an internal hardware component or using the network time protocol (NTP) which provides a real time clock through the internet, or any combination thereof. The communication bridge 1020 receives the SPPS 1010 synchronization message thereafter holds and stores a synchronization factor between the specific SPPS 1010, for example SPPS 1010-1, internal clock and the real time clock in its internal memory. The communication bridge 1020 may further make use of a database, for example but without limitations database 1040, for storing of the individual synchronization factors of each SPPS 1010 it communicates with.

Figure 15:
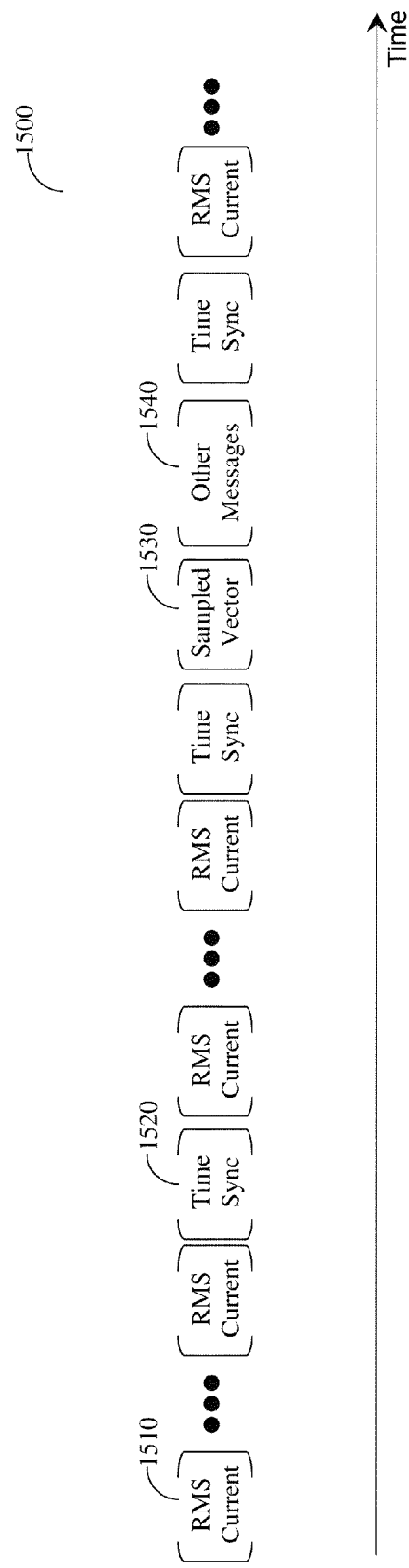
FIG. 15 is a timing diagram depicting the messages transmitted by self-powered sensor in accordance with an embodiment of the invention.

Periodically, at predefined intervals, the SPPS 1010 samples one or more periods of the secondary signal and transmits the entire sampled vector, rather than the RMS value as in normal transmissions, to the communication bridge 1020. For the purpose of synchronization a timestamp of the SPPS 1010 is also sent with the vector indicating the exact time of sampling of at least one of the samples of the vector. In another embodiment, instead of transmitting the entire sampled vector, the SPPS measures one or more significant points of the signal, and sends the timestamp of that point. Timestamps may be, without limitations, the time of the peak of the signal, timestamp of zero crossing, timestamp of a sample in the vector of plurality of samples, as well as other timestamps. FIG. 15 depicts an exemplary and non-limiting timing diagram 15 of the communication that occurs between the SPPS 1010 and the communication bridge 1020. A series of RMS current measurements 1510 are sent followed by timing synchronization information 1520, a sequence which may repeat one or more times. Periodically a sampled vector 1530 is sent as explained hereinabove. Other messages 1540 having content not specifically shown herein may also be optionally included in the sequence of messages communicated from the SPPS 1010 to the communication bridge 1020, and may contain information such as but not limited to RMS value, RMS squared value, peak value, average value, a representative average value, a vector of a plurality of samples of the at least one analog signal.

In order for the system 1000 to calculate the power factor it is necessary to further determine the line voltage signal which supplies power to the lines measured by the SPPSs 1010, for the approximate same time intervals as the information received from the SPPS 1010. In one embodiment of the invention this is performed by a direct voltage measurement by a standard voltage meter (SVM) 1075 through a wire connected from the mains power line to the SVM unit which includes an analog-to-digital converter typically via a voltage divider to reduce the voltage scale, and a communication mechanism to the bridge 1020, typically a serial connection such as, but not by way of limitation, Modbus protocol via RS232, RS485, RS422. In another embodiment, the SVM described herein can be embedded entirely or partially inside the bridge unit. In yet another embodiment of the invention this is performed by a wireless voltage sensor 1070, that constantly transmits detailed voltage RMS and voltage sampled data and timestamps. This may be done similarly to the wireless current sensor information as discussed in greater detail hereinabove. Other voltage monitoring solutions may be used without departing from the scope of the invention, including, but not limited to the use of a network connected meter 1090 or receiving the voltage information from the BMS 1080 over the network 1030.

According to the principles of the invention, once sampled current data is received from the SPPS 1010, the communication bridge 1020 uses the RMS values and the detailed simultaneous vector data of both current and voltage, SPPS time synchronization data, including but not limited to timing correction value to account for differences between the SPPS clock and the receiver's clock, and/or any other parameters transmitted by the SPPS such as peak current timing, to calculate several parameters such as, but not limited to: Phase shift between voltage and current; Real (Active) power; Apparent power; Imaginary (Reactive) power; Power Factor; Distortion factor; and, the total harmonic distortion (THD) of the line associated with a SPPS 1010. For example, without limitation, one method to calculate power factor would be to integrate simultaneous samples of voltage time current over an integer number of periods, and divide by the RMS of voltage times RMS of current. Another approach would be to calculate the cosine of the angle shift between the peak of the current signal's main frequency component and the peak of the voltage signal. The calculated values are then sent to the management server 1050 from the communication bridge 1020, to be used for various analytics and become available to applications on clients 1060. It should be noted that in one embodiment of the invention the determination of some or all of the parameters is performed by the management server 1050 that receives some or all of the raw data from the communication bridge 1020. It should be further understood that the voltage measurement may be performed for a single phase, dual pole or three phase implementations, or any other useful ways of supplying AC to a load.

In yet another embodiment, a pre-measured or calculated voltage offset value for both phase and amplitude is taken into account in the calculation of the parameters. These may take into account also voltage losses occurring between the voltage measuring point and the current measuring point (SPPS physical location) due to wire loss and/or distance.

It should be recognized that a CT-based sensor, may also cause a phase shift that may impact the accuracy of the measurements. Therefore, in one embodiment of the invention, a phase calibration factor value may be transmitted either in the message sent from the SPPS 1010 to the communication bridge 1020. Such a calibration factor may be embedded as part of the code of the SPPS 1010 during manufacturing, or, if the SPPS 1010 is susceptible to change, for example over time or a temperature range, by periodically performing a self determination of the calibration factor necessary due to the current characteristics of the SPPS 1010. In another case, the phase calibration factor may be known to the management server 1050 and may be obtained by the communication bridge 1020 through the network 1030. Regardless of the way such a calibration factor is provided, the factor may be used for the purpose of correcting the power factor or signal timing, practically on a per SPPS 1010 basis. Of course, it should be understood that a single calibration factor for all of the SPPS 1010 is also possible without departing from the scope of the invention.

In one embodiment of the invention, and as further noted hereinabove, the SPPS 1010 may have a receive mode in which it can accept information from the communication bridge 1020. In such a case it is possible to have the SPPS 1010 receive and maintain for a period of time a correct real-time clock. The phase of the voltage may also be transmitted to the SPPS 1010, for example from the communication bridge 1020, thereby enabling the SPPS 1010 to perform calculations of the phase shift between the current and the voltage rather than having it calculated centrally.

Hence, it should be understood that in an exemplary and non-limiting embodiment the SPPS, for example SPPS 1010, sends periodical synchronization messages that are provided respective of the internal clock of the SPPS 1010. WVS 1070 similarly sends such synchronization messages respective of the internal clock of the WVS 1070. In a multiphase system there may be several WVS 1070 to address each phase separately. The messages, sent by the SPPS 1010 and WVS 1070 are received by the bridge 1020 that converts the synchronization messages to conform to the bridge 1020 internal clock in a way that it associates the clock message of each of the SPPS and WVS with its internal clock value, respective to the moment in which the message was received by the bridge 1020, and further taking into account, as may be applicable, any communication delay involved in the reception of such synchronization messages. Such delay may include the time between the clock read at the SPPS or WVS and its reception at the bridge 1020. In addition, the delay may include a pre-calibrated value of the SPPS phase shift resulting from the current transformer it includes. The original synchronization messages as well as the bridge converted synchronization messages are then sent from the bridge 1020 to a server, for example management server 1050. The server 1050 can now calculate synchronization factors that allow expression of the SPPS 1010 clock and WVS 1070 clock in terms of a common clock. Such a common clock may be the bridge 1020 internal clock or any real-time clock referenced to the bridge 1020 internal clock (not shown). In parallel to the synchronization messages, any SPPS 1010 of the system 1000 may send a message with the timing of a measured peak in terms of the respective SPPS 1010 internal clock. A WVS 1070 sample a voltage peak and sends a message in terms of the VS 1070 internal clock. The bridge 1020 forwards the messages to the server 1050 that now uses the pre-calculated synchronization coefficients to express the current and voltage peaks in terms of a common clock. Such timing values may now be used to calculate the phase shift between the voltage and current. As noted hereinabove, it is possible to have an embodiment where instead of performing the calculations on the server 1050 the calculations are performed on the bridge 1020.

The principles of the invention, wherever applicable, are implemented as hardware, firmware, software or any combination thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit. The circuits described hereinabove may be implemented in a variety of manufacturing technologies well known in the industry including but not limited to integrated circuits (ICs) and discrete components that are mounted using surface mount technologies (SMT), and other technologies. The scope of the invention should not be viewed as limited by the types of packaging and physical implementation of the SPPS 110 or the communication bridge 1020.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A method of operation of a self-powered power sensor (SSPS), the method comprising:
    checking periodically if a reservoir capacitor of a SSPS is adequately charged for the purpose of switching from an energy harvesting mode of the SSPS to a current sensing mode of the SSPS;
    switching to the sensing mode upon determination that the reservoir capacitor is adequately charged to power the SSPS in the current sensing mode;
    repeating a plurality of times a sampling at a predetermined rate a plurality of samples of a current of a secondary winding of a current transformer (CT) of the SSPS;
    determining a current value respective of the plurality of samples of the current of the secondary winding, and a time synchronization signal, the time synchronization signal being configured to account for an internal drift of a clock of a microcontroller to be smaller than an allowed error in a current to voltage phase measurement; and
    transmitting the current value and the time synchronization signal so that a receiver determines at least an electrical parameter.

2. The method of claim 1, wherein the transmitting further comprises transmitting of a time stamp of a peak value of the plurality of samples of the current of the secondary winding.

3. The method of claim 1, wherein the current value is: a root-mean square (RMS) value, a peak value, an average value, an RMS squared value, a representative average value, or a vector of the plurality of samples.

4. The method of claim 3, further comprising:
transmitting periodically to a receiver the time synchronization signal for clock synchronization between a clock of the receiver and a clock of the SPPS.

5. The method of claim 4, further comprising:
calculating at least one of: a timing correction value to account for differences between the SPPS clock and the clock of the receiver, current, phase shift between voltage and current, real power, apparent power, reactive power, power factor, distortion factor, or total harmonic distortion (THD) of an analog signal represented by the plurality of samples of the current.

6. The method of claim 4, wherein the receiver is: a communication bridge, or a server.

7. The method of claim 1, further comprising:
receiving periodically by the SPPS a real-time synchronization signal for synchronizing a clock of the SPPS with a clock of a receiver.

8. The method of claim 7, wherein the clock of the receiver is a real-time clock.

9. The method of claim 1, further comprising:
transmitting periodically a signal from the SPPS containing at least a phase calibration factor.

10. The method of claim 1, further comprising:
switching from the sensing mode of the SPPS to the energy harvesting mode of the SPPS upon determination that the reservoir capacitor is inadequately charged to power the SPPS in the current sensing mode.

* * * * *